United States Patent
Yilmaz

(10) Patent No.: US 9,252,768 B2
(45) Date of Patent: Feb. 2, 2016

(54) POSITION-SENSING PANEL

(75) Inventor: Esat Yilmaz, Eastleigh (GB)

(73) Assignee: Atmel Corporation, San Jose, CA (US)

( * ) Notice: Subject to any disclaimer, the term of this patent is extended or adjusted under 35 U.S.C. 154(b) by 1150 days.

(21) Appl. No.: 12/880,836

(22) Filed: Sep. 13, 2010

(65) Prior Publication Data

US 2012/0062472 A1  Mar. 15, 2012

(51) Int. Cl.
*G06F 3/041* (2006.01)
*H03K 17/96* (2006.01)
*G06F 3/044* (2006.01)

(52) U.S. Cl.
CPC ............ *H03K 17/9622* (2013.01); *G06F 3/041* (2013.01); *G06F 3/044* (2013.01); *G06F 2203/04103* (2013.01); *G06F 2203/04107* (2013.01); *H03K 2217/960775* (2013.01)

(58) Field of Classification Search
USPC .......................................... 345/173–178, 156
See application file for complete search history.

(56) References Cited

U.S. PATENT DOCUMENTS

| | | | |
|---|---|---|---|
| 7,663,607 B2 | 2/2010 | Hotelling | |
| 7,864,503 B2 | 1/2011 | Chang | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 8,217,902 B2 | 7/2012 | Chang | |
| 8,723,824 B2 | 5/2014 | Myers | |
| 2005/0270273 A1* | 12/2005 | Marten | 345/173 |
| 2006/0097991 A1* | 5/2006 | Hotelling et al. | 345/173 |
| 2008/0309635 A1 | 12/2008 | Matsuo | |
| 2009/0160796 A1* | 6/2009 | Jiang et al. | 345/173 |
| 2009/0194344 A1* | 8/2009 | Harley et al. | 178/18.06 |
| 2009/0315854 A1 | 12/2009 | Matsuo | |
| 2010/0045615 A1* | 2/2010 | Gray et al. | 345/173 |
| 2010/0156811 A1 | 6/2010 | Long et al. | |
| 2010/0156819 A1* | 6/2010 | Takahashi et al. | G06F 3/044 345/173 |
| 2010/0164889 A1* | 7/2010 | Hristov et al. | 345/173 |
| 2010/0302201 A1* | 12/2010 | Ritter et al. | 345/174 |
| 2011/0018557 A1 | 1/2011 | Badaye | |
| 2011/0095990 A1 | 4/2011 | Philipp et al. | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0076612 A1 | 3/2013 | Myers | |
| 2014/0218335 A1 | 8/2014 | Teranishi | |
| 2014/0292703 A1 | 10/2014 | Yilmaz | |

FOREIGN PATENT DOCUMENTS

WO   WO 2012/129247   9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
(Continued)

*Primary Examiner* — Thuy Pardo
(74) *Attorney, Agent, or Firm* — Baker Botts L.L.P.

(57) ABSTRACT

A touch position sensing panel including first and second electrode layers shaped with repeating patterns. Each electrode pattern is interpolated with adjacent electrode patterns.

19 Claims, 16 Drawing Sheets

(56) References Cited

OTHER PUBLICATIONS

U.S. Appl. No. 61/454,894, filed Mar. 21, 2011, Rothkopf.
Yilmaz, U.S. Appl. No. 13/851,225, Touch Sensor with Edge-Balanced Macro-Feature Design Patent Application filed Mar. 27, 2013.
Yilmaz, U.S. Appl. No. 13/851,225, Requirement for Restriction/Election dated Sep. 12, 2013.
Yilmaz, U.S. Appl. No. 13/851,225, Response to Election/Restriction dated Nov. 12, 2013.
Yilmaz, U.S. Appl. No. 13/851,225, Non-Final Rejection dated Feb. 6, 2014.
Yilmaz, U.S. Appl. No. 13/851,225, Amendment After Non-Final dated May 6, 2014.
Yilmaz, U.S. Appl. No. 13/851,225, Applicant Initiated Interview Summary dated May 7, 2014.
Yilmaz, U.S. Appl. No. 13/851,225, Final Rejection dated May 15, 2014.
Yilmaz, U.S. Appl. No. 13/851,225, Applicant Summary of Interview with Examiner dated Jun. 6, 2014.
Yilmaz, U.S. Appl. No. 13/851,225, RCE and Amendment dated Aug. 15, 2014.
Yilmaz, U.S. Appl. No. 12/880,836, Non-final Office Action dated Dec. 5, 2014.
News, New Silver Conductive Inks Target High-Growth Touch Screen and OLED Markets, DuPont Microcircuit Materials Expands Innovative Offerings for Printed Electronics, Research Triangle Park, N.C., Apr. 13, 2010, Printed from website: http://www2dupont.com/MCM/en_US/news_events/article20100413.html on Apr. 20, 2010.
Cambrios Technologies Corporation Awarded Department of Defense Contract for Flexible Solar Cells, Sunnyvale, CA, Apr. 12, 2010, Cambrios Technologies Corp., Printed from website: http://www.cambrios.com/200/DOD_Release.htm on Apr. 20, 2010.
Horteis et al., "Fine Line Printed and Plated Contacts on High Ohmic Emitters Enabling 20% Cell Efficiency," Fraunhofer Institute for Solar Energy Systems, IEEE (2009).
Core Applications & Technologies, Printing of Antennas and Flexible Circuits, Conductive InkJet Technology Ltd. (2009).
Latest News, Conductive InkJet Technology, Printed from Website: http://www.conductiveinkjet.com/about-us/latest-news/2009.aspx on Apr. 20, 2010.
Yilmaz, U.S. Appl. No. 13/851,225, Response to Non-final Office Action dated Apr. 6, 2015.
Yilmaz, U.S. Appl. No. 13/851,225, Final Office Action dated Apr. 21, 2015.
Fletcher R. Rothkopf, U.S. Appl. No. 61/454,894, filed Mar. 21, 2011, Provisional Patent Application.
Yilmaz, U.S. Appl. No. 13/851,225, RCE and Response filed Sep. 21, 2015.
Scott A. Myers, U.S. Appl. No. 61/454,936, filed Mar. 21, 2011, Provisional Patent Application.
Stephen Brian Lynch, U.S. Appl. No. 61/454,950, filed Mar. 21, 2011, Provisional Patent Application.

* cited by examiner

POSITION-SENSING PANEL

BACKGROUND

A position sensor is a device that can detect the presence and location of a touch, by a finger or by an object, such as a stylus within an area of an external interface of the position sensor. In a touch sensitive display application, the position sensor enables direct interaction with what is displayed on the screen, rather than indirectly with a mouse or touchpad. Position sensors can be attached to or provided as part of devices with a display, including but not limited to computers, personal digital assistants, satellite navigation devices, mobile telephones, portable media players, portable game consoles, public information kiosks, and point of sale systems. Position sensors have also been used as control panels on various appliances.

There are a number of different types of position sensors/touch screens, such as resistive touch screens, surface acoustic wave touch screens, capacitive touch screens, etc. A capacitive touch screen, for example, may include an insulator, coated with a transparent conductor in a particular pattern. When an object, such as a finger or a stylus, touches or is provided in close proximity to the surface of the screen there is a change in capacitance. This change in capacitance is sent to a controller for processing to determine the position of the touch.

In a mutual capacitance configuration, for example, an array of conductive drive electrodes or lines and conductive sense electrodes or lines can be used to form a touch screen having a plurality of capacitive nodes. A node is formed where each drive and sense electrode overlaps. The sense electrodes are capacitively coupled with the drive electrodes at the nodes. A pulsed or alternating voltage applied on the drive electrode may therefore induce a charge on the sense electrode and the amount of induced charge is susceptible to external influence, such as from the proximity of a nearby finger. When an object touches the surface of the screen, the capacitance change at each individual node on the grid can be measured to determine the location or position of the touch. Interpolation processing of signals from the sense electrode can be used to determine the location of the touch that is in between electrodes or nodes, but it may not be possible to determine the location of such a touch with sufficient accuracy in some situations, particularly if the object making the touch is relatively small, such as a stylus.

SUMMARY

Disclosed are examples of a touch position sensing panel including first and second electrode layers shaped with repeating patterns. Each electrode pattern is interpolated with adjacent electrode patterns.

BRIEF DESCRIPTION OF THE FIGURES

The figures depict one or more implementations in accordance with the present teachings, by way of example only, not by way of limitation. In the figures, like reference numerals refer to the same or similar elements.

DETAILED DESCRIPTION

Reference now is made in detail to the examples illustrated in the accompanying figures and discussed below.

A display may be overlaid with a position-sensing panel. The display may include various forms. Examples include, but are not limited to a liquid crystal, such as, active matrix liquid crystal, electroluminescent, electrophoretic, plasma, cathode-ray display, OLED, or the like. It will be appreciated that light emitted from the display should be able to pass through the position-sensing panel with minimal absorption or obstruction in order for information on the display to be clearly visible.

Figure 1:
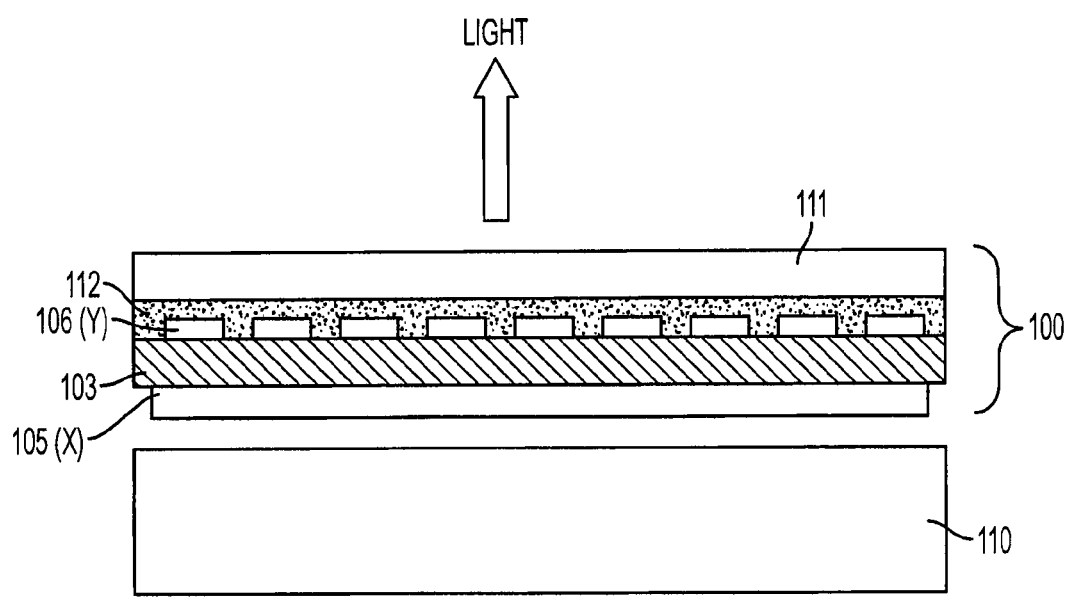
FIG. 1 illustrates schematically a cross-section of an exemplary position sensing panel.

FIG. 1 illustrates an exemplary touch position-sensing panel 100 which overlies a display 110. In the panel 100, a substrate 103 has a first 105(X) and second 106(Y) electrodes provided on opposite sides of the substrate 103. The substrate 103 has a surface on each side. The electrodes 105(X) and 106(Y) may be formed on opposing surfaces of the substrate 103. The substrate 103 is also provided adjacent to the display 110 such that one electrode 105(X) is between the display 110 and the substrate 103. An air gap is formed between the display 110 and the first electrode 105(X) and an adhesive layer 112 is between the second electrode 106(Y) and the transparent covering sheet 111.

While clear conductors such as ITO are commonly used for electrodes, in some cases opaque metal conductors are used to reduce cost and decrease electrode resistance as compared with ITO. Some screens may be made of conductive mesh which may be of copper, silver or other conductive materials.

In other embodiments, the touch position-sensing panel may have a second substrate (not shown). For example, such a touch position-sensing panel has a transparent panel, a first adhesive layer on the panel, a first electrode layer having first electrodes, a first substrate, a second adhesive layer, a second electrode layer having second electrodes, and a second substrate. In such an example, the first conductive electrode layer is attached to the first substrate and the second electrode is attached to the second substrate.

Display 110 may be selected from any of the aforementioned displays. Substrate 103, which forms a core of the position-sensing panel 100 may be formed from a transparent, non-conductive material such as glass or a plastic. Examples of suitable plastic substrate materials include, but are not limited to polyethylene terephthalate (PET), polyethylene naphthalate (PEN), polycarbonate (PC), or polymethyl methacrylate (PMMA). However, the panel structure and production methodology may be utilized in other types of touch position-sensing panels. In the example, drive (X) electrodes 105(X) are provided on one surface of the substrate 103, and sense (Y) electrodes 106(Y) are provided on the opposing surface of the substrate 103. Capacitive sense channels or nodes are formed by capacitive coupling between overlapping sections of the first and second electrodes 105(X) and 106(Y).

Transparent covering sheet 111 is provided over the substrate 103, and may be joined thereto by any means. One exemplary means is a pressure-sensitive adhesive. In one example, the covering sheet 111 may be glass, polycarbonate, or PMMA.

The drive electrodes 105(X) may have solid areas of ITO, and the sense electrodes 106(Y) may be formed in wire patterns, described in more detail below. A sense area of the position-sensing panel is formed by the X and Y electrodes overlying one another. The gaps between adjacent X electrodes may be made as narrow as possible to enhance their shielding ability against noise arising from the underlying display. In some examples, at least 90% of the sense area is covered by ITO in the X electrode layer, and the gap between adjacent ITO X electrodes may be no more than 200 microns.

ITO is discussed here by way of an example of a clear conductive material for a set of the electrodes, e.g. for the drive electrodes 105(X) in FIG. 1. However, any clear conductive material may be used, such as other inorganic and organic conductive materials, such as antimony tin oxide, tin oxide, PEDOT or other conductive polymers, carbon nanotube or metal nanowire impregnated materials, and the like.

In one example, the drive electrodes are made of ITO which forms a plurality of channels with sense electrodes on an adjacent plane.

The sense electrodes 106(Y) may be formed from a conductive material, such as a metal. Suitable metals include copper, silver, gold, aluminum, and tin and other metals suitable for use in conductive wiring. The sense electrodes may be patterned in narrow lines to allow most of the light emitted from the display and incident on the sense electrode layer to pass through the sense electrode layer. The narrow lines are optionally no more than 20 microns wide. For example, the lines can be 10 microns wide. In another example, the lines can be 5 microns wide. An exemplary range is 3-10 microns. Narrower lines reduce their visibility to the naked eye. By forming sense electrodes 106(Y) from conductive lines, the position sense panel may be formed, in one example, such that no more than 10% of the active area is covered by Y electrodes. In another example, the position sense panel may be formed such that no more than 5% of the active area is covered by Y electrodes. In another example, the position sense panel may be formed such that no more than 3% of the active area is covered by Y electrodes. Limiting the coverage of the active area by Y electrodes allows for good transparency of the position-sensing panel. Moreover, at these thicknesses the narrow line pattern is invisible or virtually invisible to the naked eye and as such should not result in any perceptible darkening or other loss of display quality.

In one example, sense electrodes 106(Y) are formed as outlines of stripes in a crisscross pattern although it will be appreciated that any pattern may be used that allows most light incident on the sense electrode layer to pass through gaps in the layer. Each sense electrode 106(Y) may have a pattern, such as a rectangular perimeter line and crisscross pattern. The narrow line pattern allows most light incident on this electrode layer to pass through the gaps in the layer with minimal obstruction. In other examples, the lines making up electrodes 106(Y) can be arranged in an anti-moire pattern to suppress optical interference effects with the underlying display, for example, by using odd angles for the lines, breaking up straight lines into zigzag patterns, using curved lines, using randomized line segment angles and placements, and the like.

In the illustrated examples, the drive electrodes 105(X) may be formed by solid areas of ITO. Alternatively, the drive electrodes 105(X) could be formed by narrow line patterns of conductive material similarly to the sense electrodes 106(Y).

The drive and sense electrodes may form patterns that are interpolated. For example, two adjacent electrodes may form a pattern in which each electrode has side portions which cover the same stripe-shaped region of a panel, such as a sensing region. Each electrode may cover a portion of the stripe-shaped region, alternating coverage between one electrode and the other along a length of the side regions in an interleaved manner. In some examples, the adjacent electrodes have side portions which each cover half of the side regions. However, any proportion of the side regions may be covered by the electrode.

Figure 2A:
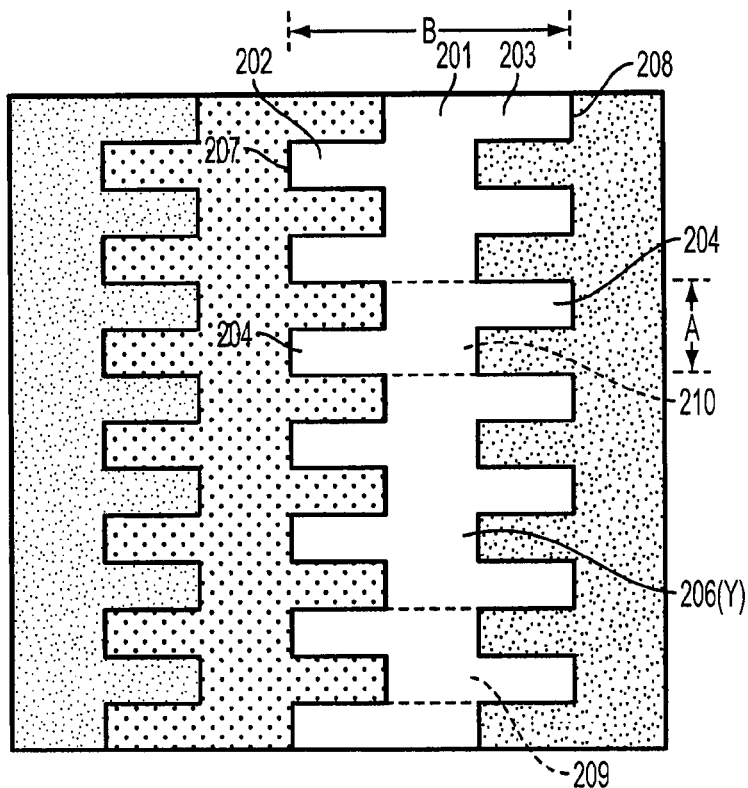
FIG. 2a illustrates schematically a first arrangement of sense electrodes of an exemplary position sensing panel.

FIG. 2a illustrates a section of a sense electrode layer with a first example of a pattern of the sense electrodes 206(Y) shown in isolation from the rest of the position-sensing panel. In FIG. 2a, two adjacent sense electrodes 206(Y) are shown, together with parts of two other sense electrodes 206(Y). A section of each sense electrode 206(Y) having seven repeating shape elements 210 is shown. The figures show the numbers and lengths of rows and columns by way of illustration only, and the numbers and length shown are not limiting.

As shown in FIG. 2a, each sense electrode 206(Y) has an outer boundary encompassing a regular repeating pattern extending in the Y direction such as a rectangular continuous central strip or central region 201 with side strips or striped side regions 202, 203, the two side strips 202, 203 being located on opposite sides of, and parallel with, the central strip 201. Each sense electrode 206(Y) has edges 207 and 208. Each side strip 202, 203 has rectangular arms 204 of conductive electrode separated by rectangular spaces overlaying the respective side strip 202 or 203. In this example, the width of each rectangular arm 204 of conductive electrode is equal to the width of each of the rectangular spaces between the rectangular arms 204 so that half of the area of each side strip 202, 203 is covered by the conductive electrode material of the sense electrode 206(Y). The length of each rectangular arm 204 is equal to the width of the continuous central strip 201.

The outer boundary of each sense electrode 206(Y) may cover a portion of the area of the central strip 201. In one example, 100%, or all of the area of the central strip 201 may be covered. 50%, or half of the area of each of the side strips 202 and 203 may be covered by the sense electrode 206(Y), except for minor gaps, represented by lines in the drawing, that are formed between the adjacent electrodes. The patterns of the side strips of adjacent electrodes may be complimentary, so that in the example, side strips with two adjacent electrodes together cover 100% of the area of the strip, except for minor gaps, represented by lines in the drawing, that are formed between the adjacent electrodes.

In other examples, the two adjacent electrodes may cover only a portion of the area of the side strips 202 or 203. The sense electrodes 206(Y) may each have a similar pattern. In this example, the rectangular arms 204 are formed in alternating fashion such that a rectangular arm in one side region 202 is not in the same row as that of a rectangular arm in the other side region 203.

As shown in FIG. 2a the rectangular conductive arms 204 of adjacent sense electrodes 206(Y) may be interpolated, with the rectangular arms 204 of each sense electrode 206(Y) being located in the rectangular spaces between the rectangular arms of the adjacent sense electrodes 206(Y).

The shape of each sense electrode 206(Y) may be made up of a plurality of repeated shape elements 210, each shape element 210 having one conductive rectangular arm 204 in each side strip 202, 203 and the section of the central strip 201 linking these two conductive rectangular arms 204. The ends of a single shape element 210 are indicated by dashed lines in FIG. 2a. Each shape element 210 has a length A equal to twice the width of a rectangular arm 204. The length A is the repeat length of the sense electrode pattern. Each shape element 210 has a width B equal to the total width of the central strip 201 and the two side strips 202 and 203, which in this example is equal to three times the length of a rectangular arm 204. The width B is equal to the distance between the edges 207, 208 of the sense electrode 206(Y). The length A is not equal to the width B.

Figure 2B:
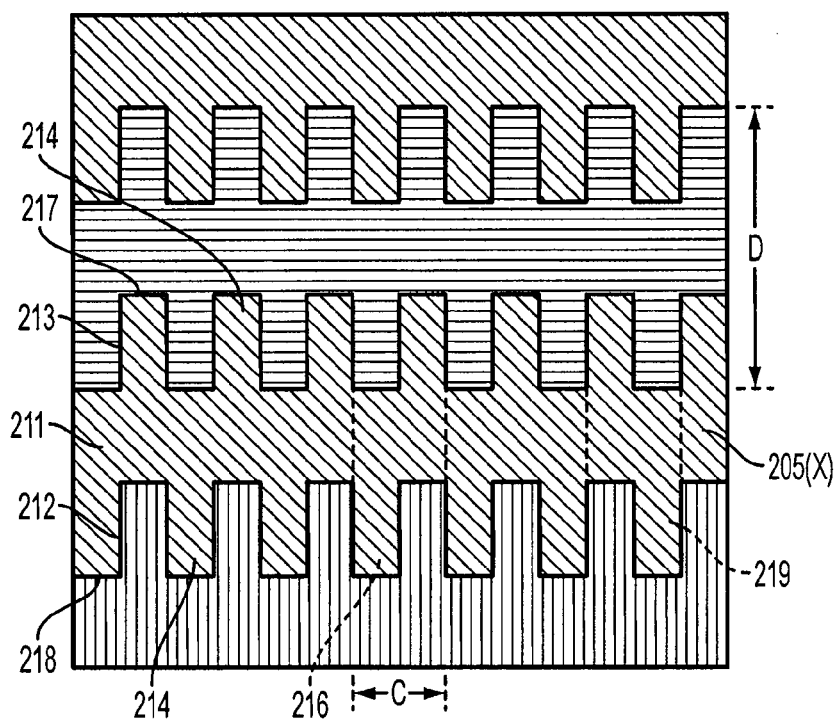
FIG. 2b illustrates schematically a first arrangement of drive electrodes of an exemplary position sensing panel.

FIG. 2b illustrates a section of a drive electrode layer with a first example of a pattern of the drive electrodes 205(X) shown in isolation from the rest of the position sensing panel. In FIG. 2b, two adjacent drive electrodes 205(X) are shown, together with parts of two other drive electrodes 205(X) and a section of each drive electrode 205(X) having seven repeating shape elements 216 in length is shown. In the examples shown in the figures the number and lengths of rows and columns shown is by way of illustration only, and the number and length shown is not limiting.

As shown in FIG. 2b, each drive electrode 205(X) has an outer boundary forming a regular repeating pattern extending in an X direction such as a rectangular continuous central strip or central region 211 with side strips or striped side regions 212, 213, the two side strips 212, 213 being located on opposite sides of the central strip 211. Each drive electrode 205(X) has edges 217 and 218. Each side strip 212, 213 has rectangular arms 214 of conductive electrode material separated by rectangular spaces. In this example, the width of each rectangular arm 214 is equal to the width of each of the rectangular spaces between the rectangular arms 214 so that half of the area of each side strip 212, 213 is covered by the conductive electrode material of the drive electrode 205(X). The length of each conductive arm 214 is equal to the width of the continuous central strip 211.

The outer boundary of each drive electrode 205(X) may cover a portion of the central strip 211. In the example shown in FIG. 2b, 100% of the area of the central strip 211 and 50% of the area of each of the side strips 212 and 213 are covered, except for minor gaps. The minor gaps are represented by lines in the drawing that are formed between the adjacent electrodes. The patterns of the side strips of adjacent electrodes may be complimentary, so that in the example, side strips with two adjacent electrodes together cover 100% of the area of the strip, except for minor gaps, represented by lines in the drawing, that are formed between the adjacent electrodes. The drive electrodes 205(X) may each have a similar pattern.

As shown in FIG. 2b the rectangular conductive arms 214 of adjacent drive electrodes 205(X) are interpolated, with the rectangular arms 214 of each drive electrode 205(X) being located in the rectangular spaces between the rectangular arms of the adjacent drive electrodes 205(X).

The shape of each drive electrode 205(X) may have a plurality of repeated shape elements 216, each shape element 216 having one conductive rectangular arm 214 in each side strip 212, 213 and the section of the central strip 211 linking these two conductive rectangular arms 214. The ends of a single shape element 216 are indicated by dashed lines in FIG. 2b. Each shape element 216 may have a length C equal to twice the width of a rectangular arm 214. The length C is the repeat length of the drive electrode pattern. Each shape element 216 may have a width D equal to the total width of the central strip 211 and the two side strips 212 and 213. In this example, the width is equal to three times the length of a rectangular arm 214. The width D is equal to the distance between the edges 217, 218 of the drive electrode 105(X). In this example, the length C is not equal to the width D.

There may be gaps between adjacent drive and sense electrodes 205(X) and 206(Y), so that the width of each rectangular arm 214, 204 is slightly less than the width of each of the rectangular spaces in order to allow for the gaps. The gaps between the drive and sense electrodes adjacent to each other are at the outer boundaries of each electrode.

The dimensions of the drive and sense electrodes 205(X) and 206(Y) may be interrelated.

In some examples, the ratio of the length A of the repeating shape element 210 of the sense electrode 206(Y), the repeat length of the sense electrode pattern, to the width D of the repeating shape element 216 of the drive electrode 205(X) is a rational number. The ratio of the length A of the repeating shape element 210 of the sense electrode 206(Y), the repeat length of the sense electrode pattern, to the width D of the repeating shape element 216 of the drive electrode 205(X) can be expressed as the quotient of two non-zero integers.

For example, FIGS. 2a and 2b show that the width D of the repeating shape element 216 of the drive electrode 205(X) is three times the length A of the repeating shape element 210 of the sense electrode 206(Y).

Similarly, in some examples the ratio of the width B of the repeating shape element 210 of the sense electrode 206(Y) to the length C of the repeating shape element 216 of the drive electrode 205(X), the repeat length of the drive electrode pattern, may be a rational number. The ratio of the width B of the repeating shape element 210 of the sense electrode 206

(Y) to the length C of the repeating shape element 216 of the drive electrode 205(X), the repeat length of the drive electrode pattern, can be expressed as the quotient of two non-zero integers.

For example, FIGS. 2a and 2b show that the width B of the repeating shape element 210 of the sense electrode 206(Y) is three times the length C of the repeating shape element 216 of the drive electrode 205(X).

Figure 2C:
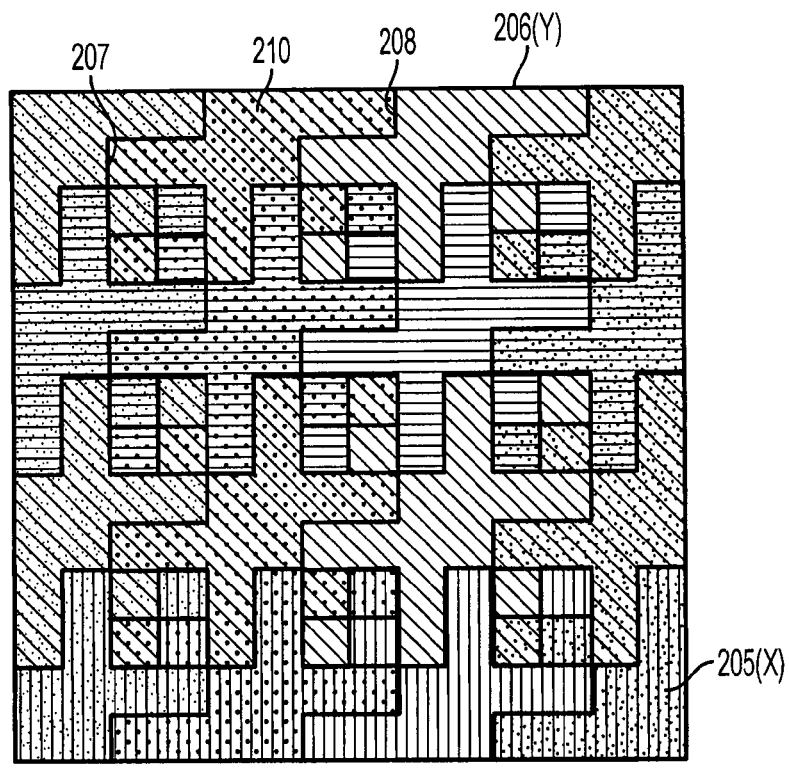
FIG. 2c illustrates schematically a first combined arrangement of the sense electrodes of FIG. 2a and the drive electrodes of FIG. 2b of an exemplary position sensing panel.

The drive electrodes 205(X) may be arranged in a first direction and the sense electrodes 206(Y) may be arranged in a second direction to cross over one another so that the sense electrodes are capacitively coupled with the drive electrodes where they overlap. FIG. 2c shows an example of alignment of the drive electrodes 205(X) and the sense electrodes 206(Y).

In the examples shown, the drive electrodes 205(X) are arranged in a different direction than the sense electrodes 206(Y). The drive and sense electrodes 205(X) and 206(Y) are arranged so that at least some side edges 207, 208 of the sense electrodes 206(Y) are aligned with at least some ends of the shape elements 216 of the drive electrodes 205(X), and so that at least some side edges 217, 218 of the drive electrodes 205(X) are aligned with at least some ends of the shape elements 210 of the sense electrodes 206(Y).

In the example illustrated in FIG. 2c, the drive and sense electrodes 205(X) and 206(Y) are arranged so that each side edge 207, 208 of each sense electrode 206(Y) is aligned with the ends of shape elements 216 of the drive electrodes 205(X), and each side edge 217, 218 of each drive electrode 205(X) is aligned with the ends of shape elements 210 of the sense electrodes 206(Y). Further, the drive and sense electrodes 205(X) and 206(Y) are arranged so that each end of each shape element 216 of each drive electrode 205(X) is aligned with a side edge 207, 208 of a sense electrode 206(Y), and each end of each shape element 206 of each sense electrode 206(Y) is aligned with a side edge 217, 218 of a drive electrode 205(X).

The patterns of the sense electrodes 206(Y) shown in FIG. 2a can alternatively be formed of shape elements 209, which are opposite handed compared to the shape elements 210.

The patterns of the sense electrodes 205(X) shown in FIG. 2b can alternatively be formed of shape elements 219, which are opposite handed compared to the shape elements 216.

The drive and sense electrodes 205(X) and 206(Y) can be aligned based on the different shape elements 210, 209 and 216, 219.

Figure 2D:
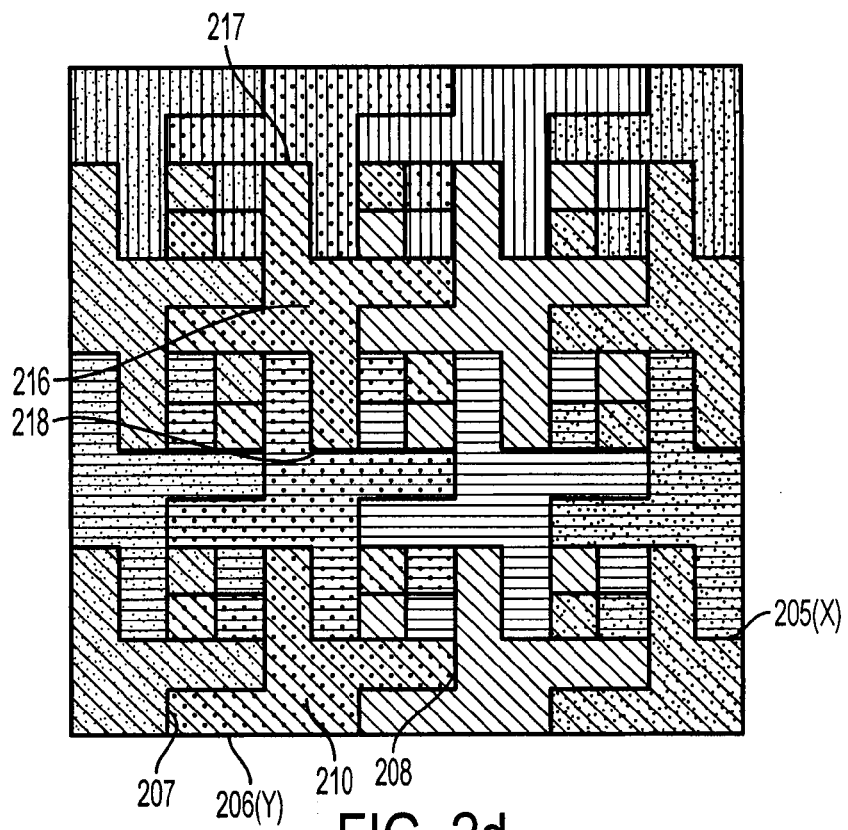
FIG. 2d illustrates schematically a second combined arrangement of the sense electrodes of FIG. 2a and the drive electrodes of FIG. 2b of an exemplary position sensing panel.

In the example illustrated in FIG. 2d, the drive and sense electrodes 205(X) and 206(Y) are arranged so that each side edge 207, 208 of each sense electrode 206(Y) is aligned with the ends of shape elements 219 of the drive electrodes 205(X), and each side edge 217, 218 of each drive electrode 205(X) is aligned with the ends of shape elements 210 of the sense electrodes 206(Y). Further, the drive and sense electrodes 205(X) and 206(Y) are aligned so that each end of each shape element 219 of each drive electrode 205(X) is aligned with a side edge 207, 208 of a sense electrode 206(Y), and so that each end of each shape element 210 of each sense electrode 206(Y) is aligned with a side edge 217, 218 of a drive electrode 205(X). The drive electrode 205(X) in FIG. 2d is a mirror image of its arrangement in FIG. 2c.

Figure 3A:
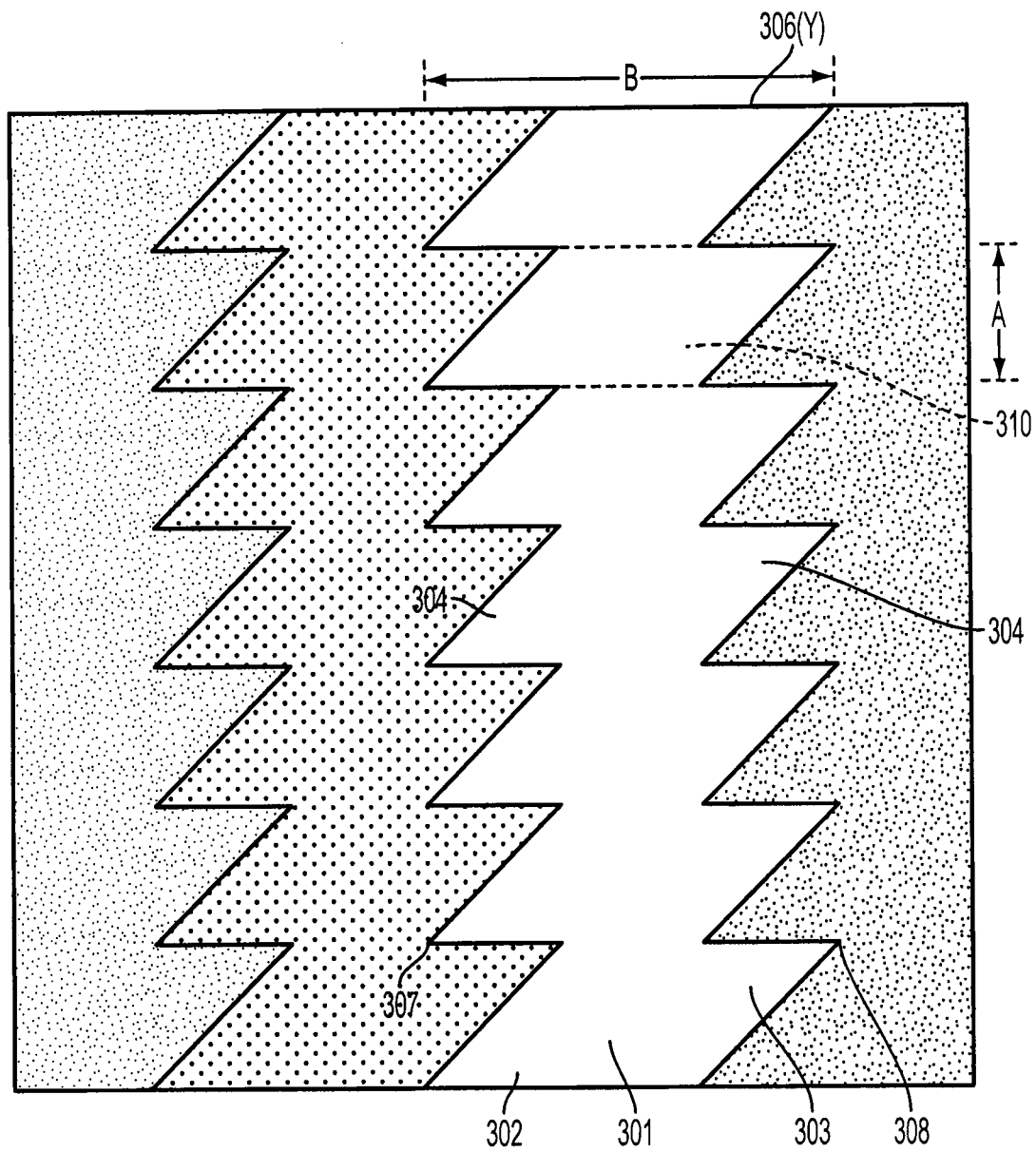
FIG. 3a illustrates schematically a second arrangement of sense electrodes of an exemplary position sensing panel.

FIG. 3a illustrates a section of a sense electrode layer with a second example of a pattern of the sense electrodes 306(Y) shown in isolation from the rest of the position-sensing panel. In FIG. 3a, two adjacent sense electrodes 306(Y) are shown, together with parts of two other sense electrodes 306(Y). A section of each sense electrode 306(Y) having seven repeating shape elements 310 is shown.

Figure 3B:
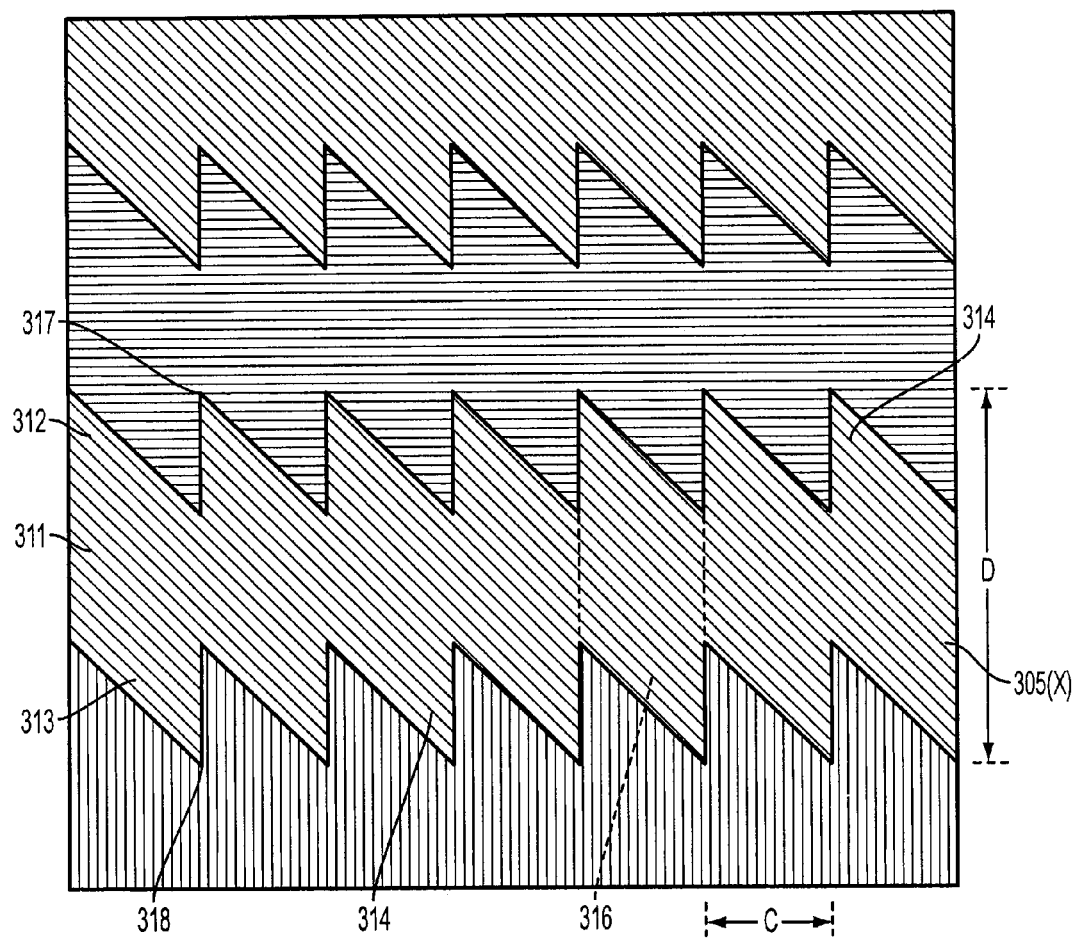
FIG. 3b illustrates schematically a second arrangement of drive electrodes of an exemplary position sensing panel.

As shown in FIG. 3b, each sense electrode 306(Y) has a regular repeating pattern extending in the Y direction such as a rectangular continuous central strip 301 with side strips 302, 303, the two side strips 302, 303 being located on opposite sides of the central strip 301. In this example, each sense electrode 306(Y) has edges 307 and 308. Each side strip 302, 303 has triangular projections 304 of conductive electrode separated by triangular spaces so that half of the area of each side strip 302, 303 is covered by the conductive electrode material of the sense electrode 306(Y). In this example, the length A of each triangular projection 304 may be equal to the width of the continuous central strip 301.

In this example, each sense electrode 306(Y) covers 100% of the area of the central strip 301 and 50% of the area of each of the side strips 302 and 303, except for minor gaps, represented by lines in the drawing, that are formed between the adjacent electrodes. The sense electrodes 306(Y) may each have a similar pattern.

As shown in FIG. 3a, the triangular conductive projections 304 of adjacent sense electrodes 306(Y) may be interpolated, with the triangular projections 304 of each sense electrode 306(Y) being located in the triangular spaces between the triangular projections 304 of the adjacent sense electrodes 306(Y).

The shape of each sense electrode 306(Y) may have a plurality of repeated shape elements 310, each shape element 310 having one conductive triangular projection 304 in each side strip 302, 303 and the section of the central strip 301 linking these two conductive triangular projections 304. The ends of a single shape element 310 are indicated by dashed lines in FIG. 3a. Each shape element 310 has a length A equal to the width of a triangular projection 304. The length A is the repeat length of the sense electrode pattern. Each shape element 310 has a width B equal to the total width of the central strip 301 and the two side strips 302 and 303, which in this example is equal to three times the length A of a triangular projection 304. The width B is equal to the distance between the edges 307, 308 of the sense electrode 306(Y).

FIG. 3b illustrates a section of a drive electrode layer with a second example of a pattern of the drive electrodes 305(X) shown in isolation from the rest of the position-sensing panel. In FIG. 3b, two adjacent drive electrodes 305(X) are shown, together with parts of two other drive electrodes 305(X). A section of each drive electrode 305(X) having seven repeating shape elements 316 is shown.

As shown, each drive electrode 305(X) has a regular repeating pattern extending in the X direction such as a rectangular continuous central strip 311 with side strips 312, 313, the two side strips 312, 313 being located on opposite sides of the central strip 311. Each drive electrode 305(X) has edges 317 and 318. Each side strip 312, 313 has triangular projections 314 of conductive electrode separated by triangular spaces so that half of the area of each side strip 312, 313 is covered by the conductive electrode material of the drive electrode 305(X). The length of each triangular projection 314 is equal to the width of the continuous central strip 311. Each drive electrode 305(X) covers 100% of the area of the central strip 311 and 50% of the area of each of the side strips 312 and 313, except for minor gaps, represented by lines in the drawing, that are formed between the adjacent electrodes. The drive electrodes 305(X) may each have a similar pattern.

As shown in FIG. 3b, the triangular conductive projections 314 of adjacent drive electrodes 305(X) may be interpolated, with the triangular projections 314 of each drive electrode 305(X) being located in the triangular spaces between the triangular projections 314 of the adjacent drive electrodes 305(X).

The shape of each drive electrode 305(X) may have a plurality of repeated shape elements 316, each shape element 316 having one conductive triangular projection 314 in each side strip 312, 313 and the section of the central strip 311 linking these two conductive triangular projections 314. The ends of a single shape element 316 are indicated by dashed lines in FIG. 3b. In this example, each shape element 316 may have a length C equal to the width of a triangular projection 314. The length C is the repeat length of the drive electrode pattern. Each shape element 316 may have a width D equal to the total width of the central strip 311 and the two side strips 312 and 313, in this example equal to three times the length of a triangular projection 314. In this example, the width D is equal to the distance between the edges 317, 318 of the drive electrode 305(X).

For example, FIGS. 3a and 3b show that the width D of the repeating shape element 316 of the drive electrode 305(X) is three times the length A of the repeating shape element 310 of the sense electrode 306(Y), and that the width B of the repeating shape element 310 of the sense electrode 306(Y) is three times the length C of the repeating shape element 316 of the drive electrode 305(X).

Figure 3C:
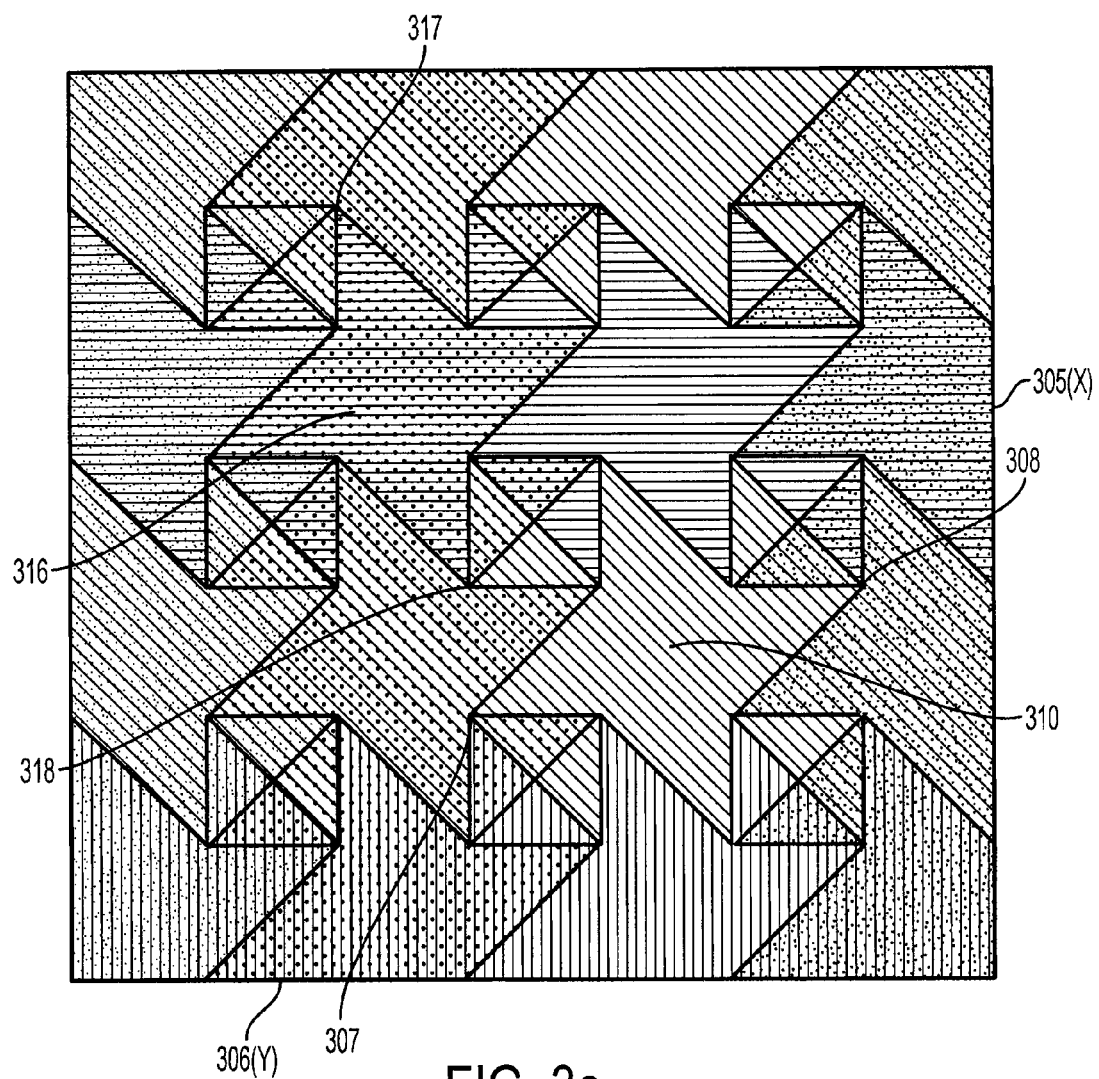
FIG. 3c illustrates schematically a first combined arrangement of the sense electrodes of FIG. 3a and the drive electrodes of FIG. 3b of an exemplary position sensing panel.

In the example illustrated in FIG. 3c the drive and sense electrodes 305(X) and 306(Y) may be arranged so that each side edge 307, 308 of each sense electrode 306(Y) is aligned with the ends of shape elements 316 of the drive electrodes 305(X), and each side edge 317, 318 of each drive electrode 305(X) is aligned with the ends of shape elements 310 of the sense electrodes 306(Y). Further, the drive and sense electrodes 305(X) and 306(Y) are arranged so that each end of each shape element 316 of each drive electrode 305(X) is aligned with a side edge 307, 308 of a sense electrode 306(Y), and so that each end of each shape element 310 of each sense electrode 306(Y) is aligned with a side edge 317, 318 of a drive electrode 305(X).

Figure 3D:
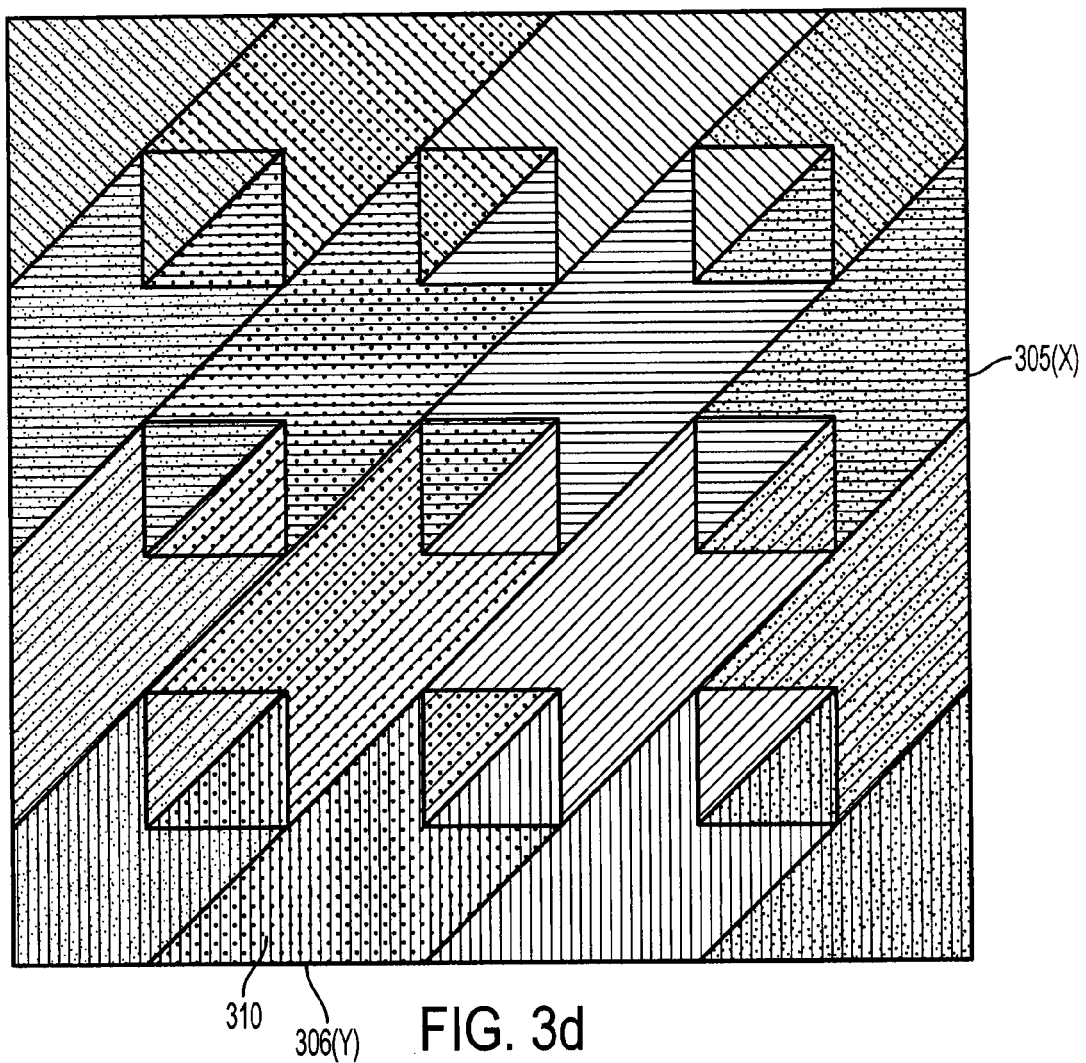
FIG. 3d illustrates schematically a second combined arrangement of the sense electrodes of FIG. 3a and the drive electrodes of FIG. 3b of an exemplary position sensing panel.

In the example illustrated in FIG. 3d, a sense electrode pattern according to a second arrangement of the sense electrode of FIG. 3a together with the drive electrode pattern shown in FIG. 3b is shown such that the left-right orientation of the pattern is reversed.

In the example illustrated in FIG. 3d, the drive electrode 305(X) and the sense electrode of FIG. 3a, 306(Y) are arranged so that each side edge of each sense electrode 306 (Y) is aligned with the ends of shape elements of the drive electrodes 305(X), and each side edge of each drive electrode 305(X) is aligned with the ends of shape elements 310 of the sense electrodes 306(Y). Further, the drive and sense electrodes 305(X) and 306(Y) may be arranged so that each end of each shape element of each drive electrode 305(X) is aligned with a side edge of a sense electrode 306(Y), and each end of each shape element of each sense electrode 306(Y) is aligned with a side edge of a drive electrode 305(X).

The repeating shapes forming the sense and drive electrode patterns can be different.

Figure 4A:
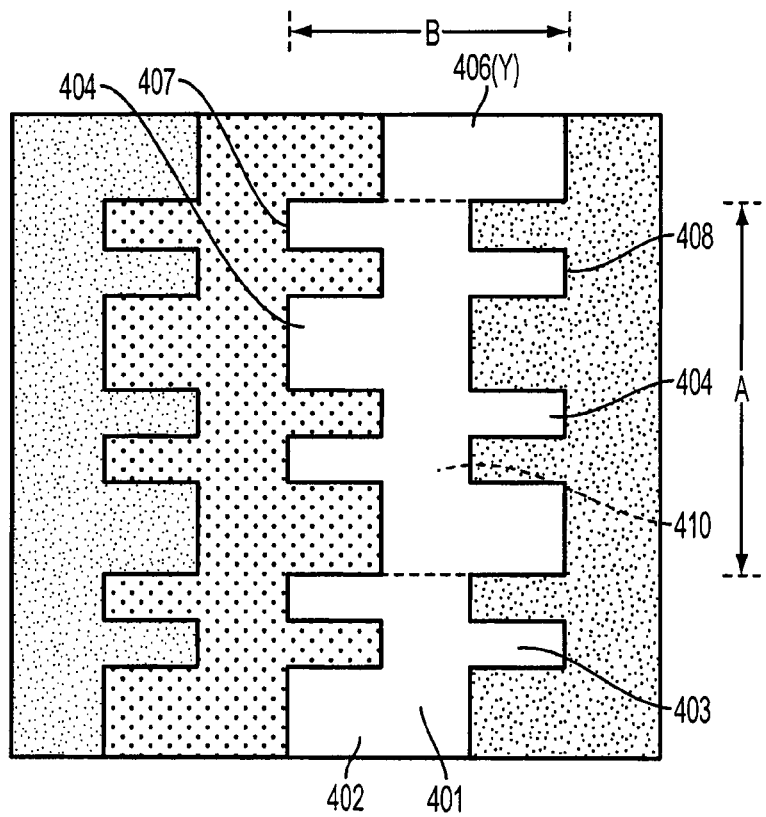
FIG. 4a illustrates schematically a third arrangement of sense electrodes of an exemplary position sensing panel.

FIG. 4a illustrates a section of a sense electrode layer with a third example of a pattern of the sense electrodes 406(Y) shown in isolation from the rest of the position sense panel.

As shown in FIG. 4a, each sense electrode 406(Y) has a regular repeating pattern extending in the Y direction such as a rectangular continuous central strip 401 with side strips 402, 403, the two side strips 402, 403 being located on opposite sides of the central strip 401. Each sense electrode 406(Y) has edges 407 and 408. Each side strip 402, 403 has rectangular arms 404 of conductive electrode separated by rectangular spaces.

The rectangular arms 404 have different widths and these different widths are equal to the different widths of the rectangular spaces between the rectangular arms 404 so that the rectangular conductive arms 404 of adjacent sense electrodes 406(Y) can be interpolated, such that the rectangular arms 404 of each sense electrode 406(Y) are located in the rectangular spaces between the rectangular arms 404 of the adjacent sense electrodes 406(Y). In this example, half of the area of each side strip 402, 403 may be covered by the conductive electrode material of the sense electrode 406(Y). The length of each conductive arm 404 may be equal to the width of the continuous central strip 401. Each sense electrode 406(Y) covers 100% of the area of the central strip 401 and 50% of the area of each of the side strips 402 and 403, except for minor gaps, represented by lines in the drawing, that are formed between the adjacent electrodes. The sense electrodes 406(Y) may each have a similar pattern.

The shape of each sense electrode 406(Y) may have a plurality of repeated shape elements 410. The ends of a single shape element 410 are indicated by dashed lines in FIG. 4a. Each shape element 410 has a length A. The length A is the repeat length of the sense electrode pattern. Each shape element 410 has a width B equal to the total width of the central strip 401 and the two side strips 402 and 403, which in this example is equal to three times the length of a rectangular arm 404. The width B is equal to the distance between the edges 407, 408 of the sense electrode 406(Y).

In FIG. 4a, two adjacent sense electrodes 406(Y) are shown, together with parts of two other sense electrodes 406(Y). A section of each sense electrode 406(Y) including one full repeated shape element 410 and a part of a further repeated shape element is shown.

Figure 4B:
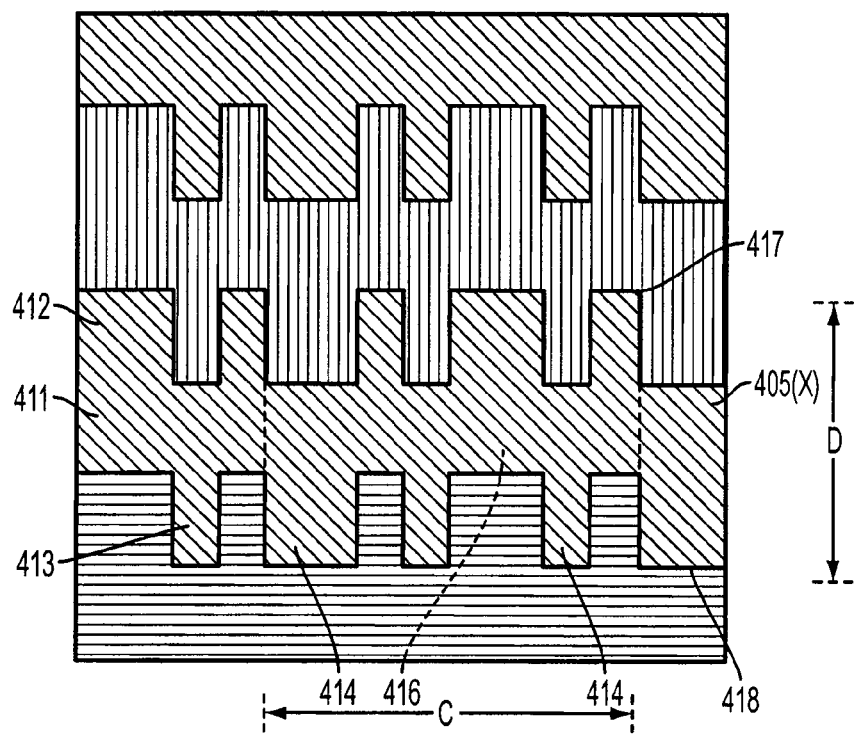
FIG. 4b illustrates schematically a third arrangement of drive electrodes of an exemplary position sensing panel.

FIG. 4b illustrates a section of a drive electrode layer with a first example of a pattern of the drive electrodes 405(X) shown in isolation from the rest of the position sense panel.

As shown, each drive electrode 405(X) has a regular repeating pattern extending in an X direction such as a rectangular continuous central strip, or region 411 with side strips 412, 413, the two side strips, or regions 412, 413 being located on opposite sides of the central strip 411. In this example, each drive electrode 405(X) has edges 417 and 418. Each side strip 412, 413 has rectangular arms 414 of conductive electrode separated by rectangular spaces. The rectangular arms 414 may have different widths and these different widths may be equal to the different widths of the rectangular spaces between the rectangular arms 414 so that the rectangular conductive arms 414 of adjacent drive electrodes 405 (X) can be interpolated, with the rectangular arms 414 of each drive electrode 405(X) being located in the rectangular spaces between the rectangular arms 414 of the adjacent drive electrodes 405(X).

In this example, half of the area of each side strip 412, 413 is covered by the conductive electrode material of the drive electrode 405(X). The length of each conductive arm 414 may be equal to the width of the continuous central strip 411. Each drive electrode 405(X) may cover 100% of the area of the central strip 411 and 50% of the area of each of the side strips 412 and 413, except for minor gaps, represented by lines in the drawing, that are formed between the adjacent electrodes. The drive electrodes 405(X) may each have a similar pattern.

The shape of each drive electrode 405(X) may have a plurality of repeated shape elements 416. The ends of a single shape element 416 are indicated by dashed lines in FIG. 4b. Each shape element 416 may have a length C. The length C is the repeat length of the drive electrode pattern. Each shape element 416 may have a width D equal to the total width of the central strip 411 and the two side strips 412 and 413, in this example equal to three times the length of a rectangular arm 414. The width D is equal to the distance between the edges 417, 418 of the drive electrode 405(X).

In FIG. 4b two adjacent drive electrodes 405(X) are shown, together with parts of two other drive electrodes 405(X). A section of each drive electrode 405(X) including one full repeated shape element and a part of a further repeated shape element is shown.

In the examples shown in FIGS. 4a and 4b, the ratio of the width D of the repeating shape element 416 of the drive electrode 405(X) to the length A of the repeating shape element 410 of the sense electrode 406(Y) is 3 to 4.

In the examples shown in FIGS. 4a and 4b, the ratio of the width B of the repeating shape element 410 of the sense electrode 406(Y) to the length C of the repeating shape element 416 of the drive electrode 405(X) is 3 to 4.

Figure 4C:
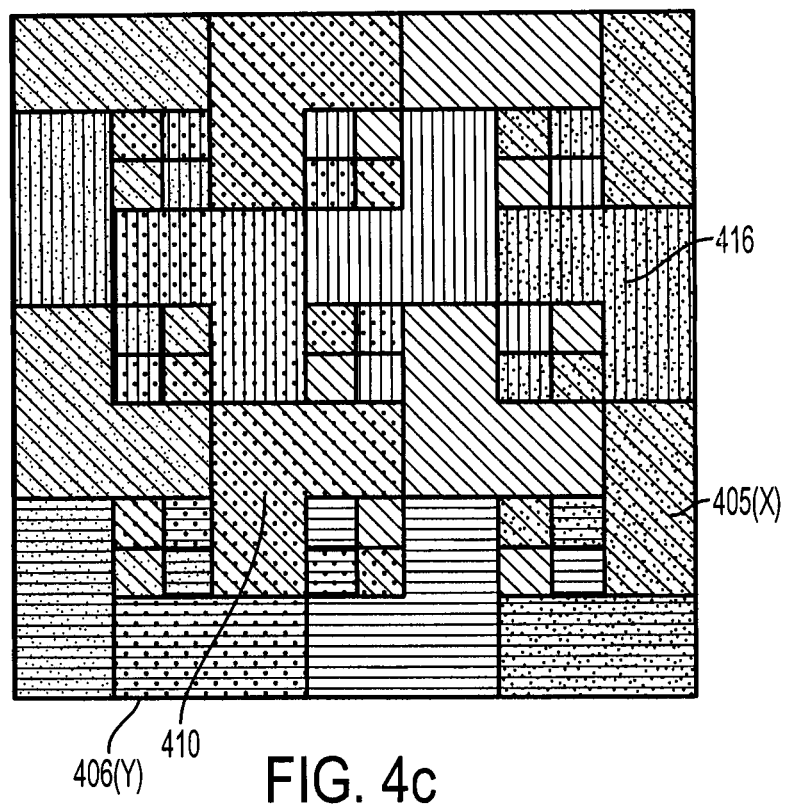
FIG. 4c illustrates schematically a combined arrangement of the sense electrodes of FIG. 4a and the drive electrodes of FIG. 4b of an exemplary position sensing panel.

In the example illustrated in FIG. 4c, the drive and sense electrodes 405(X) and 406(Y) may be arranged so that alternate sense electrodes 406(Y) have one side edge aligned with the ends of shape elements 416 of the drive electrodes 105(X), and alternate drive electrodes 405(X) have one side edge aligned with the ends of shape elements 410 of the sense electrodes 406(Y). Further, the drive and sense electrodes 405(X) and 406(Y) may be arranged so that each end of each shape element 416 of each drive electrode 405(X) is aligned with a side edge of a sense electrode 406(Y), and each end of each shape element 410 of each sense electrode 406(Y) is aligned with a side edge of a drive electrode 405(X).

Figure 5A:
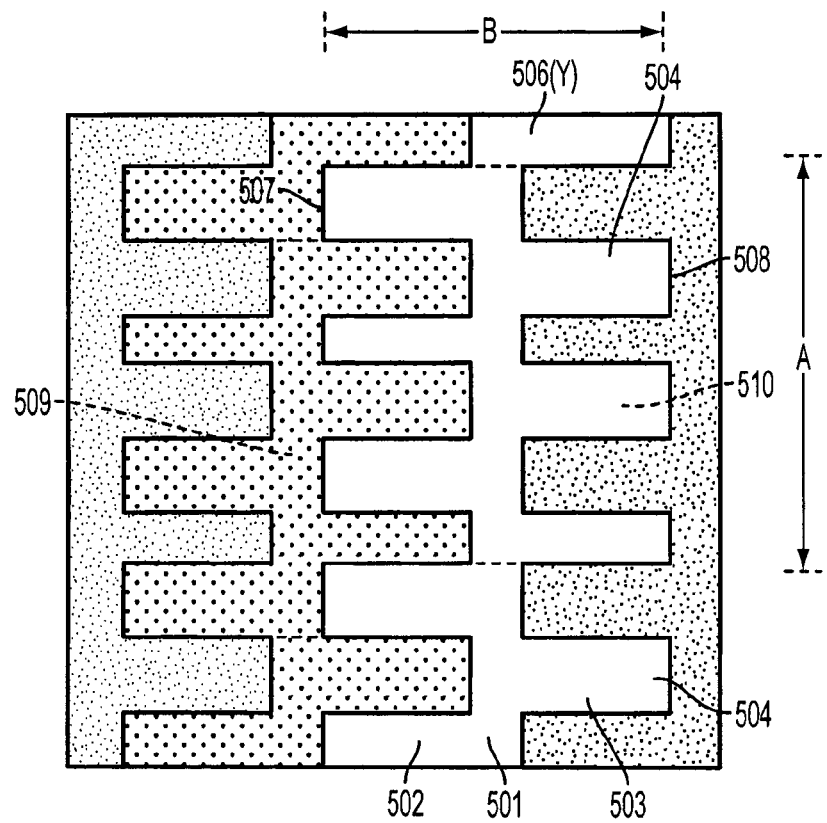
FIG. 5a illustrates schematically a fourth arrangement of sense electrodes of an exemplary position sensing panel.

FIG. 5a illustrates a section of a sense electrode layer with a fourth example of a pattern of the sense electrodes 506(Y) shown in isolation from the rest of the position sense panel. As shown, each sense electrode 506(Y) has a regular repeating pattern extending in the Y direction such as a rectangular continuous central strip 501 with side strips 502, 503, the two side strips 502, 503 being located on opposite sides of the central strip 501. Each sense electrode 506(Y) has edges 507 and 508. Each side strip 502, 503 has rectangular arms 504 of conductive electrode separated by rectangular spaces. The rectangular arms 504 have different widths and these different widths are equal to the different widths of the rectangular spaces between the rectangular arms 504 so that the rectangular conductive arms 504 of adjacent sense electrodes 506(Y) can be interpolated, with the rectangular arms 504 of each sense electrode 506(Y) being located in the rectangular spaces between the rectangular arms 504 of the adjacent sense electrodes 506(Y).

In this example, half of the area of each side strip 502, 503 is covered by the conductive electrode material of the sense electrode 506(Y). The length of each conductive arm 504 is equal to three times the width of the continuous central strip 501. Each sense electrode 506(Y) may cover 100% of the area of the central strip 501 and 50% of the area of each of the side strips 502 and 503, except for minor gaps, represented by lines in the drawing, that are formed between the adjacent electrodes. The sense electrodes 506(Y) may each have a similar pattern.

The shape of each sense electrode 506(Y) may have a plurality of repeated shape elements 510. The ends of a single shape element 510 are indicated by dashed lines in FIG. 5a. Each shape element 510 may have a length A. The length A is the repeat length of the sense electrode pattern. Each shape element 510 may have a width B equal to the total width of the central strip 501 and the two side strips 502 and 503. The width B is equal to the distance between the edges 507, 508 of the sense electrode 506(Y).

FIG. 5a shows two adjacent sense electrodes 506(Y) together with parts of two other sense electrodes 506(Y). A section of each sense electrode 506(Y) including one full repeated shape element and a part of another repeated shape element is shown.

Figure 5B:
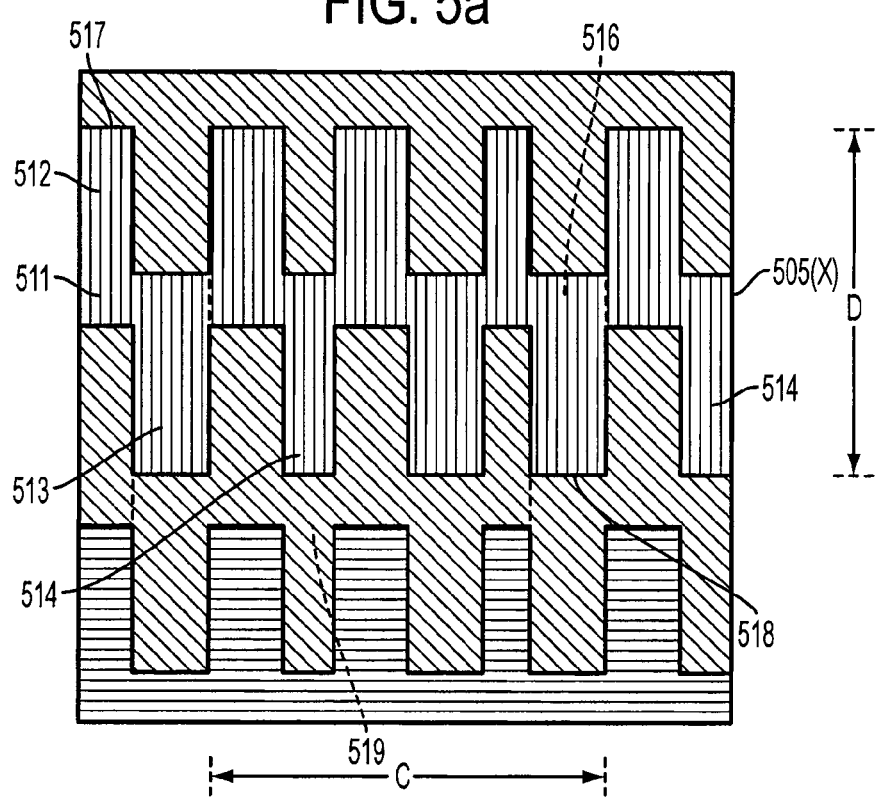
FIG. 5b illustrates schematically a fourth arrangement of drive electrodes of an exemplary position sensing panel.

FIG. 5b illustrates a section of a drive electrode layer with a first example of a pattern of the drive electrodes 505(X) shown in isolation from the rest of the position sense panel. As shown, each drive electrode 505(X) has a regular repeating pattern extending in an X direction such as a rectangular continuous central strip 511 with side strips 512, 513. The two side strips 512, 513 are located on opposite sides of the central strip 511. Each drive electrode 505(X) has edges 517 and 518. Each side strip 512, 513 has rectangular arms 514 of conductive electrode separated by rectangular spaces. The rectangular arms 514 have different widths and these different widths are equal to the different widths of the rectangular spaces between the rectangular arms 514 so that the rectangular conductive arms 514 of adjacent drive electrodes 505(X) can be interpolated. The rectangular arms 514 of each drive electrode 105(X) are located in the rectangular spaces between the rectangular arms 514 of the adjacent drive electrodes 105(X).

Half of the area of each side strip 512, 513 is covered by the conductive electrode material of the drive electrode 505(X). In this example, the length of each conductive arm 514 is equal to three times the width of the continuous central strip 511. Each drive electrode 505(X) covers 100% of the area of the central strip 511 and 50% of the area of each of the side strips 512 and 513, except for minor gaps, represented by lines in the drawing, that are formed between the adjacent electrodes. The drive electrodes 505(X) each have a similar pattern.

The shape of each drive electrode 505(X) may have a plurality of repeated shape elements 516. The ends of a single shape element 516 are indicated by dashed lines in FIG. 5b. Each shape element 516 has a length C. The length C is the repeat length of the drive electrode pattern. Each shape element 516 has a width D equal to the total width of the central strip 511 and the two side strips 512 and 513. The width D is equal to the distance between the edges 517, 518 of the drive electrode 505(X).

In FIG. 5b two adjacent drive electrodes 505(X) are shown, together with parts of two other drive electrodes 505(X). A section of each drive electrode 505(X) including one full repeated shape element and a part of a further repeated shape element is shown.

In the examples shown in FIGS. 5a and 5b, the ratio of the width D of the repeating shape element 516 of the drive electrode 505(X) to the length A of the repeating shape element 510 of the sense electrode 506(Y) is 7 to 8.

In the examples shown in FIGS. 5a and 5b, the ratio of the width B of the repeating shape element 510 of the sense electrode 506(Y) to the length C of the repeating shape element 516 of the drive electrode 505(X) is 7 to 8.

Figure 5C:
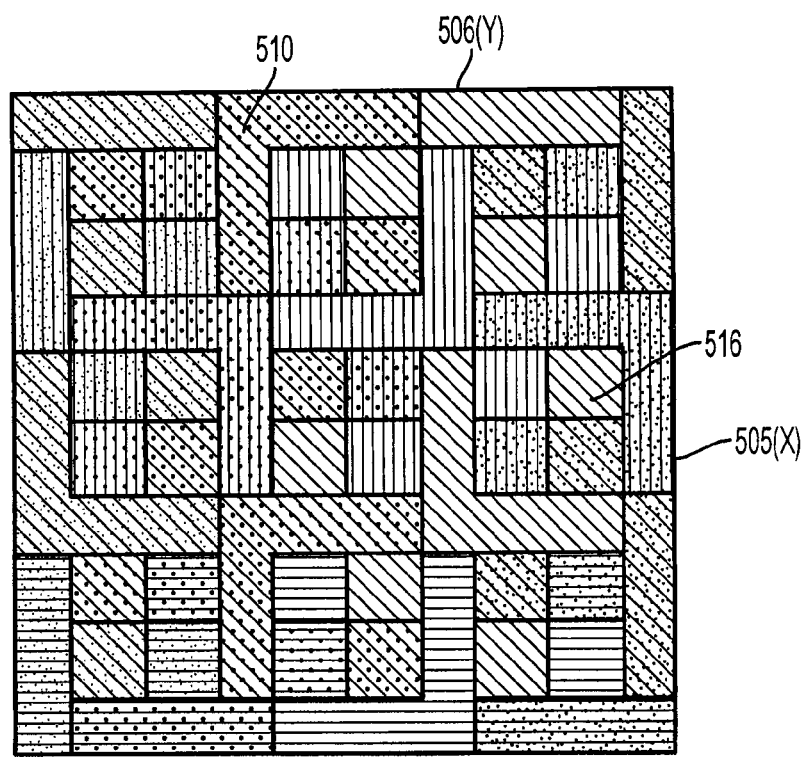
FIG. 5c illustrates schematically a first combined arrangement of the sense electrodes of FIG. 5a and the drive electrodes of FIG. 5b of an exemplary position sensing panel.

In the example illustrated in FIG. 5c, the drive and sense electrodes 505(X) and 506(Y) may be arranged so that alternate sense electrodes 506(Y) have one side edge aligned with the ends of shape elements 516 of the drive electrodes 505(X), and alternate drive electrodes 505(X) have one side edge aligned with the ends of shape elements 510 of the sense electrodes 506(Y). Further, the drive and sense electrodes 505(X) and 506(Y) may be arranged so that each end of each shape element 516 of each drive electrode 505(X) is aligned with a side edge of a sense electrode 506(Y), and each end of each shape element 510 of each sense electrode 506(Y) is aligned with a side edge of a drive electrode 505(X).

The patterns of the sense electrodes 506(Y) shown in FIG. 5a instead of being formed of shape elements 510 could, for example, be formed of shape elements 509.

The patterns of the sense electrodes 505(X) shown in FIG. 5b instead of being formed of shape elements 516 could, for example, be formed of shape elements 519.

The drive and sense electrodes 505(X) and 506(Y) can be aligned based on the different shape elements 510, 509 and 516, 519.

Figure 5D:
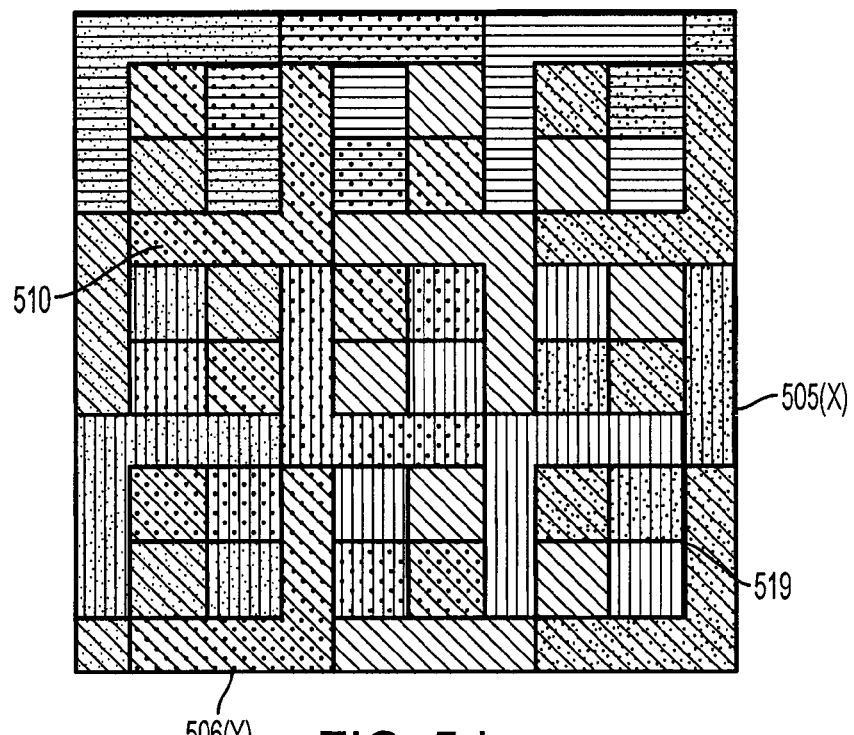
FIG. 5d illustrates schematically a second combined arrangement of the sense electrodes of FIG. 5a and the drive electrodes of FIG. 5b of an exemplary position sensing panel.

In the example illustrated in FIG. 5d, a sense electrode pattern according to a second arrangement of the sense electrode of FIG. 5a together with the drive electrode pattern shown in FIG. 5b is shown such that the left-right orientation of the pattern is reversed.

In the example illustrated in FIG. 5d, the drive and sense electrodes 505(X) and 506(Y) may be arranged so that alternate sense electrodes 506(Y) have one side edge aligned with the ends of shape elements 519 of the drive electrodes 505(X), and alternate drive electrodes 505(X) have one side edge aligned with the ends of shape elements 510 of the sense electrodes 506(Y). Further, the drive and sense electrodes 505(X) and 506(Y) may be arranged so that each end of each shape element 519 of each drive electrode 505(X) is aligned with a side edge of a sense electrode 506(Y), and each end of each shape element 510 of each sense electrode 506(Y) is aligned with a side edge of a drive electrode 505(X).

Figure 6A:
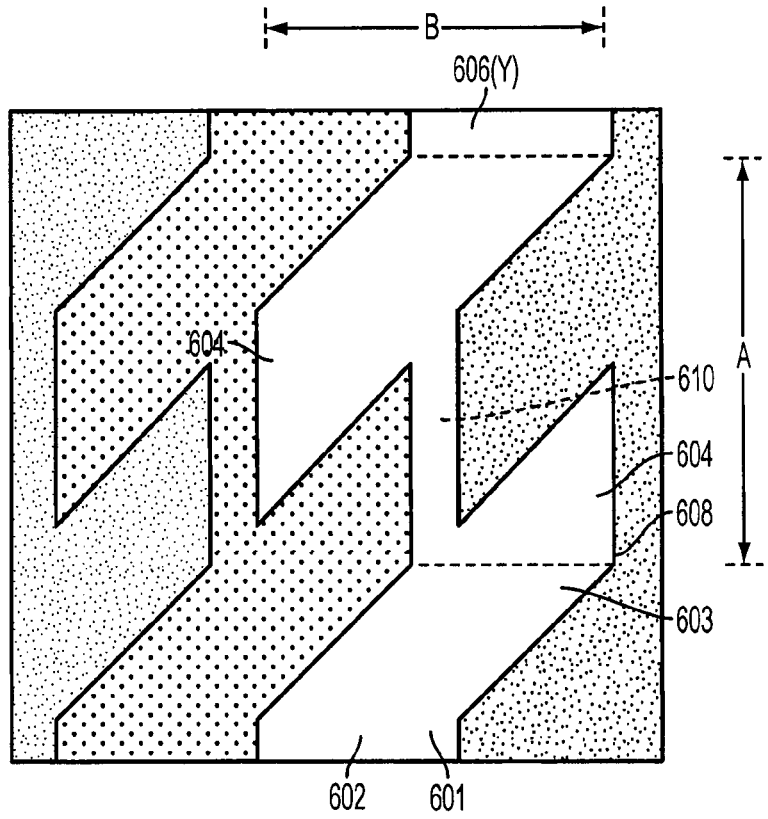
FIG. 6a illustrates schematically a fifth arrangement of sense electrodes of an exemplary position sensing panel.

FIG. 6a illustrates a section of a sense electrode layer with a fifth example of a pattern of the sense electrodes 606(Y) shown in isolation from the rest of the position sense panel. As shown, each sense electrode 606(Y) has a regular repeating pattern extending in the Y direction such as a rectangular continuous central strip 601 with side strips 602, 603, the two side strips 602, 603 being located on opposite sides of the central strip 601. Each sense electrode 606(Y) has edges 607 and 608. Each side strip 602, 603 has trapezoid arms 604 of conductive electrode separated by trapezoid spaces. The width of each trapezoid arm 604 of conductive electrode is equal to the width of each of the trapezoid spaces between the trapezoid arms 604 so that half of the area of each side strip 602, 603 is covered by the conductive electrode material of the sense electrode 606(Y).

The trapezoid conductive arms 604 of adjacent sense electrodes 606(Y) may be interpolated, with the trapezoid arms 604 of each sense electrode 606(Y) being located in the rectangular spaces between the rectangular arms of the adjacent sense electrodes 606(Y). The length of each conductive arm 604 is equal to three times the width of the continuous central strip 601. In this example, each sense electrode 606(Y) covers 100% of the area of the central strip 601 and 50% of the area of each of the side strips 602 and 603, except for minor gaps, represented by lines in the drawing, that are formed between the adjacent electrodes. The sense electrodes 606(Y) each have a similar pattern.

The shape of each sense electrode 606(Y) may have a plurality of repeated shape elements 610, each shape element 610 having one conductive arm 604 in each side strip 602, 603 and the section of the central strip 601 linking these two conductive arms 604. The ends of a single shape element 610 are indicated by dashed lines in FIG. 6a. Each shape element 610 has a length A. The length A is the repeat length of the sense electrode pattern. Each shape element 610 has a width B equal to the total width of the central strip 601 and the two side strips 602 and 603. The width B is equal to the distance between the edges 607, 608 of the sense electrode 606(Y).

FIG. 6a shows two adjacent sense electrodes 606(Y) together with parts of two other sense electrodes 606(Y). A section of each sense electrode 606(Y) including one full repeated shape element and a part of a further repeated shape element is shown.

Figure 6B:
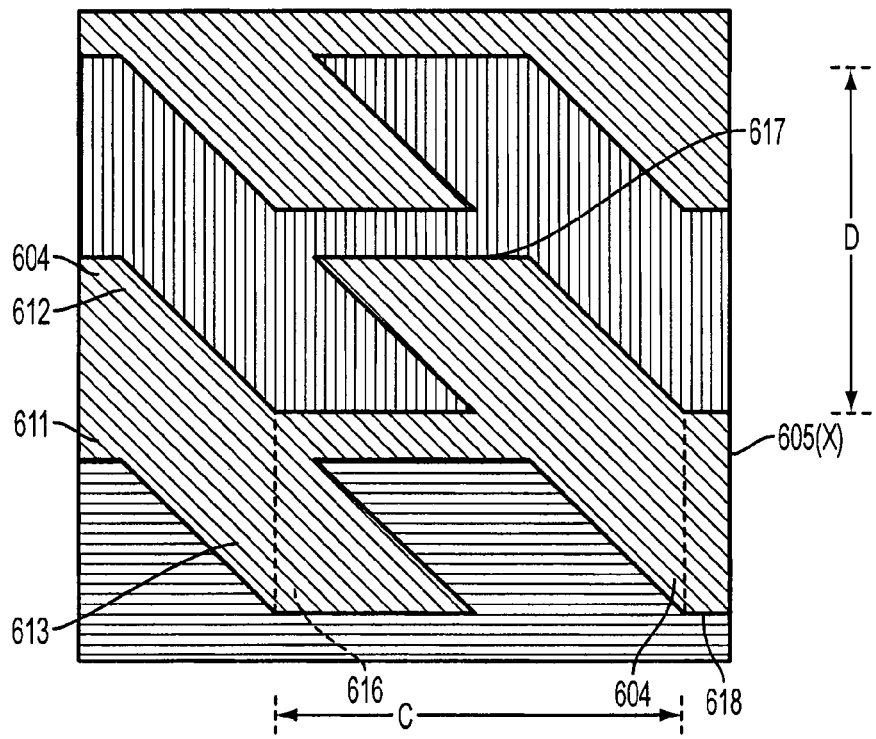
FIG. 6b illustrates schematically a fifth arrangement of drive electrodes of an exemplary position sensing panel.

FIG. 6b illustrates a section of a drive electrode layer with a fifth example of a pattern of the drive electrodes 605(X) shown in isolation from the rest of the position sense panel. As shown, each drive electrode 605(X) has a regular repeating pattern extending in an X direction such as a rectangular continuous central strip 611 with side strips 612, 613, the two side strips 612, 613 being located on opposite sides of the central strip 611. Each drive electrode 605(X) has edges 617 and 618. Each side strip 612, 613 has trapezoid arms 614 of conductive electrode separated by trapezoid spaces. In this example, the width of each trapezoid arm 614 of conductive electrode material is equal to the width of each of the trapezoid spaces between the trapezoid arms 614 so that half of the area of each side strip 612, 613 is covered by the conductive electrode material of the drive electrode 605(X).

The trapezoid conductive arms 614 of adjacent drive electrodes 605(X) may be interpolated, with the trapezoid arms 614 of each drive electrode 605(X) being located in the rectangular spaces between the rectangular arms of the adjacent sense electrodes 605(X). In this example, the length of each conductive arm 614 is equal to three times the width of the continuous central strip 611. Each drive electrode 605(X) may cover 100% of the area of the central strip 611 and 50% of the area of each of the side strips 612 and 613, except for minor gaps, represented by lines in the drawing, that are formed between the adjacent electrodes. The drive electrodes 605(X) each have a similar pattern.

The shape of each drive electrode 605(X) may have a plurality of repeated shape elements 616, each shape element 616 having one conductive trapezoid arm 614 in each side strip 612, 613 and a section of the central strip 611 linking these two conductive arms 614. The ends of a single shape element 616 are indicated by dashed lines in FIG. 6b. Each shape element 616 has a length C equal to twice the width of a rectangular arm 614. The length C is the repeat length of the drive electrode pattern. Each shape element 616 has a width D equal to the total width of the central strip 611 and the two side strips 612 and 613, in this example equal to three times the length of a rectangular arm 614. The width D is equal to the distance between the edges 617, 618 of the drive electrode 605(X).

FIG. 6b shows two adjacent drive electrodes 605(X) together with parts of two other drive electrodes 605(X). A section of each drive electrode 605(X) including one full repeated shape element and a part of a further repeated shape element is shown.

In the examples shown in FIGS. 6a and 6b, the ratio of the width D of the repeating shape element 616 of the drive electrode 605(X) to the length A of the repeating shape element 610 of the sense electrode 606(Y) is 7 to 8, and the ratio of the width B of the repeating shape element 610 of the sense electrode 606(Y) to the length C of the repeating shape element 616 of the drive electrode 605(X) is 7 to 8.

Figure 6C:
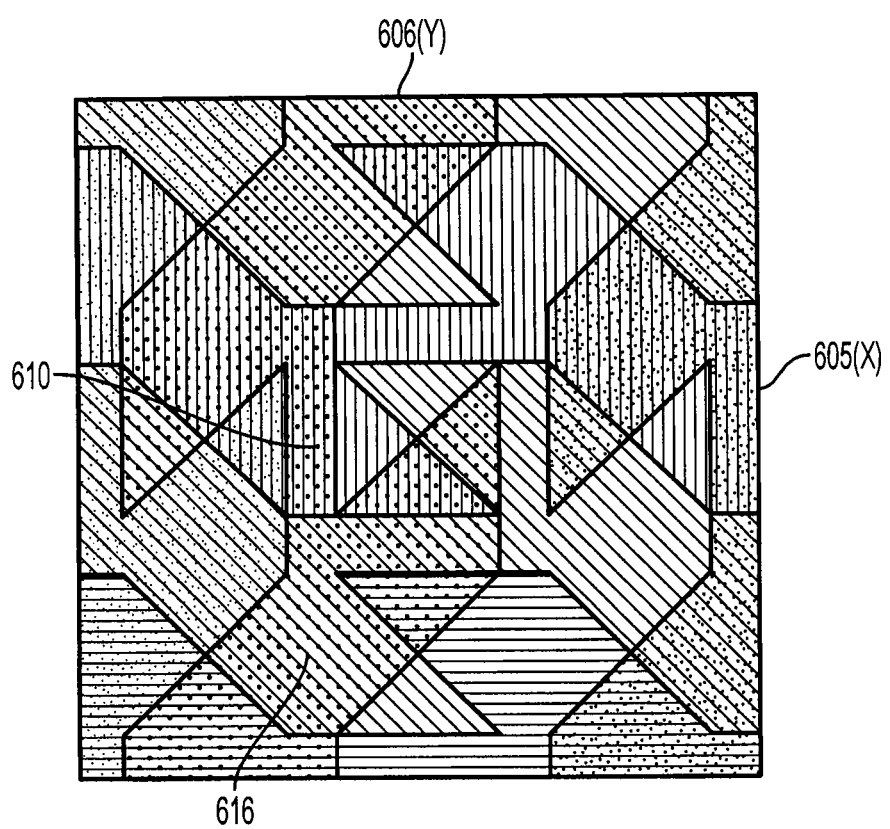
FIG. 6c illustrates schematically a combined arrangement of the sense electrodes of FIG. 6a and the drive electrodes of FIG. 6b of an exemplary position sensing panel.

In the example illustrated in FIG. 6c, the drive and sense electrodes 605(X) and 606(Y) may be arranged so that alternate sense electrodes 606(Y) have one side edge aligned with the ends of shape elements 616 of the drive electrodes 605(X), and alternate drive electrodes 605(X) have one side edge aligned with the ends of shape elements 610 of the sense electrodes 606(Y). Further, the drive and sense electrodes 605(X) and 606(Y) are arranged so that each end of each shape element 616, a shown in FIG. 6a, of each drive electrode 605(X) is aligned with a side edge of a sense electrode 606(Y), and each end of each shape element 610 of each sense electrode 606(Y) is aligned with a side edge of a drive electrode 605(X).

Figure 7A:
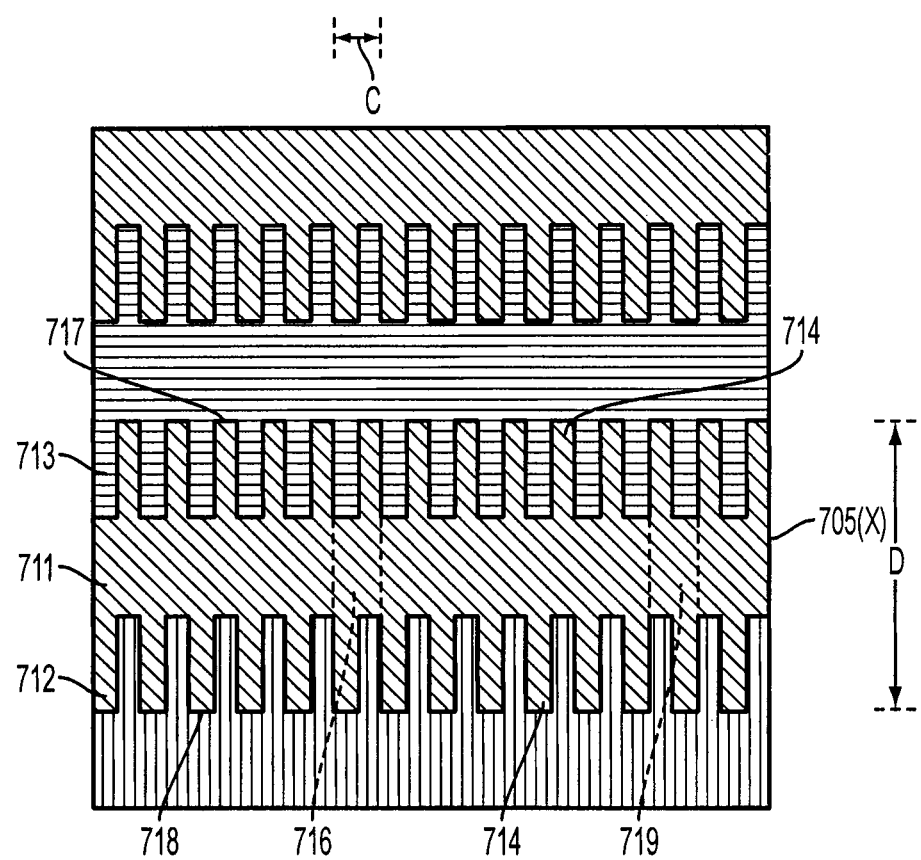
FIG. 7a illustrates schematically a sixth arrangement of drive electrodes of an exemplary position sensing panel.

FIG. 7a illustrates a section of a drive electrode layer with a sixth example of a pattern of the drive electrodes 705(X) shown in isolation from the rest of the position sense panel. The pattern of the drive electrodes 705(X) shown in FIG. 7a is geometrically similar to the pattern of the first example shown in FIG. 2b but the repeat length of the pattern of the drive electrodes 105(X) in FIG. 7a is half the repeat length of the pattern shown in FIG. 2b.

Figure 7B:
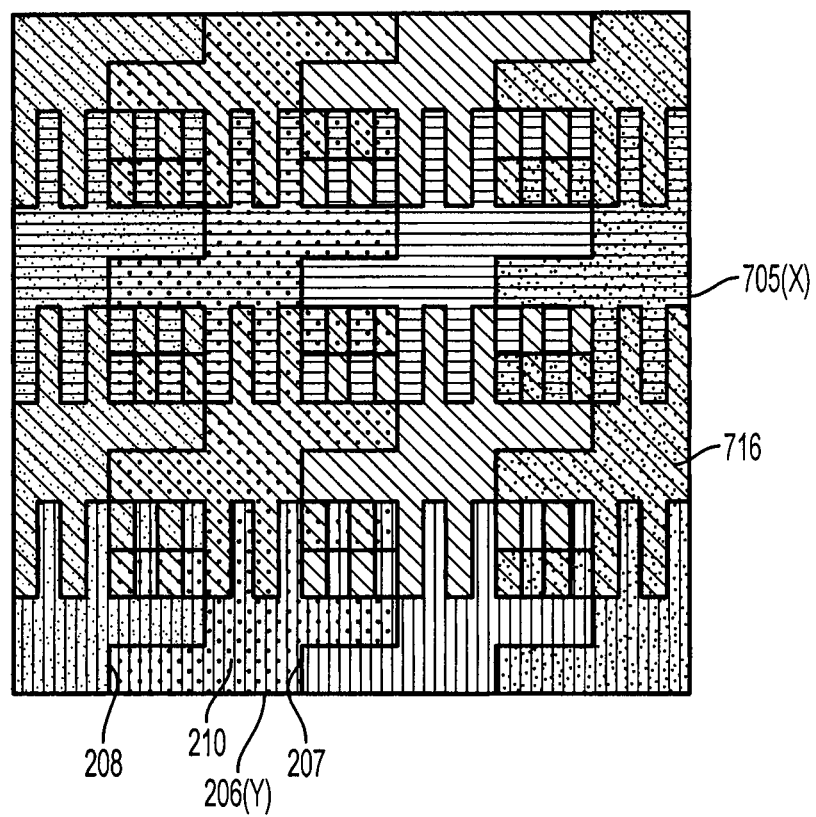
FIG. 7b illustrates schematically a combined arrangement of the sense electrodes of FIG. 2a and the drive electrodes of FIG. 7a of an exemplary position sensing panel.

In the example illustrated in FIG. 7b, the drive electrode pattern of FIG. 7a may be used together with the sense electrode pattern shown in FIG. 2a.

In the examples shown in FIGS. 2a and 7a, the width D of a repeating shape element 716 of the drive electrode 705(X) is three times the length A of the repeating shape element 210 of the sense electrode 206(Y), and the width B of the repeating shape element 210 of the sense electrode 206(Y) is six times the length C of the repeating shape element 716 of the drive electrode 705(X).

In the example illustrated in FIG. 7b, the drive and sense electrodes 705(X) and 206(Y) may be arranged so that each side edge 207, 208 of each sense electrode 206(Y) is aligned with the ends of shape elements 716 of the drive electrodes 705(X), and each side edge of each drive electrode 705(X) is aligned with the ends of shape elements 210 of the sense electrodes 206(Y). Further, the drive and sense electrodes 705(X) and 206(Y) may be aligned so that one end of each shape element 716 of each drive electrode 705(X) is aligned with a side edge 207, 208 of a sense electrode 206(Y), and each end of each shape element 210 of each sense electrode 206(Y) is aligned with a side edge of a drive electrode 705(X).

Figure 8A:
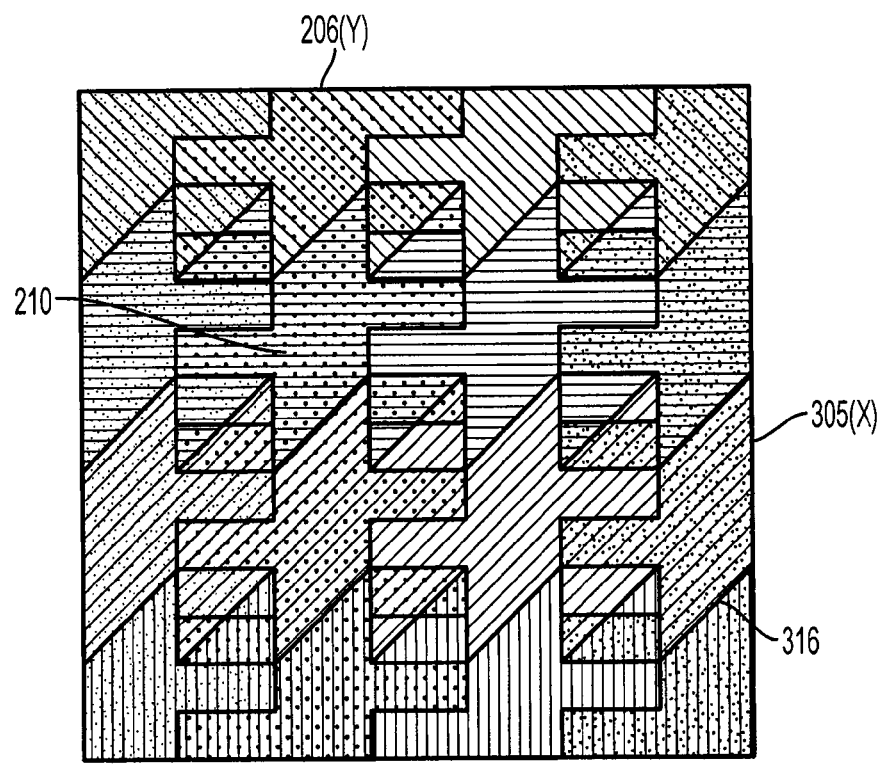
FIG. 8a illustrates schematically a first combined arrangement of the sense electrodes of FIG. 2a and the drive electrodes of FIG. 3b of an exemplary position sensing panel.

In the example illustrated in FIG. 8a, the sense electrode pattern shown in FIG. 2a may be used together with the drive electrode pattern shown in FIG. 3b. In this example, the drive and sense electrodes 305(X) and 206(Y) may be arranged so that each side edge of each sense electrode 206(Y) is aligned with the ends of shape elements 316 of the drive electrodes 305(X), and each side edge of each drive electrode 305(X) is aligned with the ends of shape elements 210 of the sense electrodes 206(Y). Further, the drive and sense electrodes 305(X) and 206(Y) may be arranged so that each end of each shape element 316 of each drive electrode 305(X) is aligned with a side edge of a sense electrode 206(Y), and each end of each shape element 210 of each sense electrode 206(Y) is aligned with a side edge of a drive electrode 305(X).

Figure 8B:
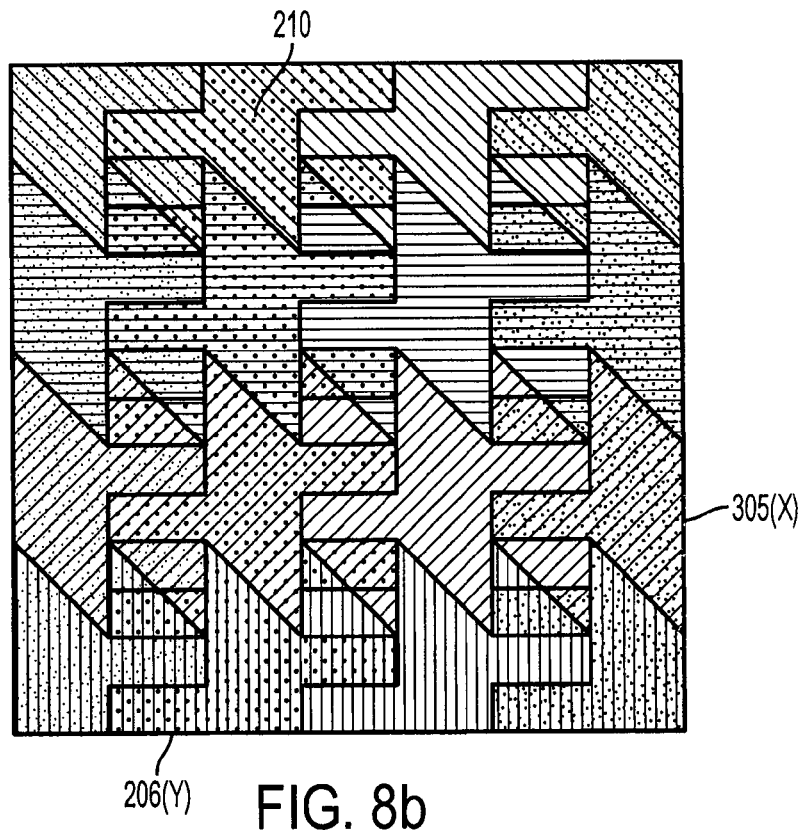
FIG. 8b illustrates schematically a second combined arrangement of the sense electrodes of FIG. 2a and the drive electrodes of FIG. 3b of an exemplary position sensing panel

In the example illustrated in FIG. 8b, the first sense electrode pattern shown in FIG. 2a may be used together with the drive electrode pattern used in FIG. 3b in a second arrangement so that the left-right orientation of the pattern is reversed as compared to FIG. 8a. In this example, the drive and sense electrodes 305(X) and 206(Y) may be arranged so that each side edge of each sense electrode 206(Y) is aligned with the ends of shape elements of the drive electrodes 305(X), and each side edge of each drive electrode 305(X) is aligned with the ends of shape elements 210 of the sense electrodes 206(Y). Further, the drive and sense electrodes 305(X) and 206(Y) may be arranged so that each end of each shape element of each drive electrode 305(X) is aligned with a side edge of a sense electrode 206(Y), and each end of each shape element 210 of each sense electrode 206(Y) is aligned with a side edge of a drive electrode 305(X).

The illustrated embodiments show only portions of sense and display electrodes for a position sense panel. The position sense panel may also include connecting lines that connect the drive electrodes and the sense electrodes to a control unit.

The transparency of the position sense panel optionally transmits at least 80% of light having a wavelength in the visible part of the electromagnetic spectrum that is incident on the panel, in particular from a display underlying the panel.

The process of manufacturing the position-sense panel illustrated in FIGS. 1-9b may include the steps of patterning drive electrodes, such as ITO drive electrodes, on one substrate surface and patterning narrow line sense electrodes on the opposite surface of the same substrate layer. The process may also include steps of forming a narrow-line metal pattern associated with drive electrodes. In the case where the drive electrodes are formed from ITO, the process of patterning the electrodes may include the following steps of depositing a positive or negative resist over unpatterned ITO on a substrate; exposing the photoresist to UV light through a mask of the appropriate pattern; developing the resist by washing away unexposed resist with a solvent, and then etching away the exposed ITO areas using a suitable etchant. The process may also include removing the exposed photoresist using a suitable solvent.

One suitable etching liquid for use in removing exposed ITO is, for example, an etching acid. An example of a suitable removal liquid for the photoresist includes organic solvents. Other suitable positive and negative photoresists, etching liquids and photoresist removal liquids may also be used.

Alternatively, ITO may for example be deposited on the substrate by sputtering ITO onto the substrate using a shadow mask having a pattern suitable for formation of electrodes in the shape as described above.

The process of patterning the narrow line Y electrodes may include deposition of the conductive material, for example metal, by evaporation through a mask in the appropriate pattern.

Alternatively, the narrow-line metal may be formed by a printing process in which a conductive material or conductive material precursor is printed (for example, by inkjet printing) to form the Y electrode pattern. In the case where a catalytic precursor ink is used, the process may include treating the precursor ink to convert the ink to a conductive material, such as by electroless plating. Alternatively, the substrate may be uniformly coated with a catalytic photosensitive ink which is exposed to UV light through a photomask or vector-exposed to UV light from a laser or other suitable light source. The substrate may then be rinsed with solvent to wash away the unexposed ink, and then the remaining ink is immersed in a metal plating bath to form the conductive traces.

Lead-outs for connection of the sense electrodes to a control unit of the position-sense panel may be formed in the same process step as formation of the sense electrodes.

Although some exemplary processes are given above for forming drive electrodes and sense electrodes, it will be appreciated that any suitable way of forming these electrodes and conductors can be used in conjunction with the disclosure provided herein.

The touch position sensors described above can be attached to numerous electronic devices, such as computers, personal digital assistants, satellite navigation devices, mobile phones, portable media players, portable game consoles, public information kiosks, point of sale systems, etc. These electronic devices may typically include a central processor or other processing device for executing program instructions, an internal communication bus, various types of memory or storage media, such as RAM, ROM, EEPROM, cache memory, disk drives, etc., for code and data storage, and one or more network interface cards or ports for communication purposes.

The exemplary technologies discussed in the detailed description above may provide a touch position sense panel having one or more properties of thinness, shielding of the panel by the drive electrodes from electric field noise, high transparency and low manufacturing cost.

Various modifications may be made to the examples described in the foregoing, and any related teachings may be applied in numerous applications, only some of which have been described herein. It is intended by the following claims to claim any and all applications, modifications and variations that fall within the true scope of the present teachings.

While the above discussion is pertinent to mutual capacitance drive approaches, self-capacitance drive methods also have similar problems and therefore may be similarly improved by application of the technologies discussed in the examples above.

The invention claimed is:

1. A touch position-sensing panel comprising:
   a sensing area;
   a plurality of first electrodes formed of a conductive material, at least one of the first electrodes formed from a plurality of conductive lines each having a width of less than 20 microns; and
   a plurality of second electrodes formed of a conductive material, at least one of the second electrodes formed from a plurality of conductive lines each having a width of less than 20 microns, wherein:
      the plurality of first electrodes are arranged in a first direction,
      the plurality of second electrodes are arranged in a second direction different from the first direction such that the first and second electrodes overlap in the sensing area,
      each of the plurality of first electrodes has an outer boundary shaped as a repeating pattern having a first repeat length and a first width, and
      each of the plurality of second electrodes has an outer boundary shaped as a repeating pattern having a second repeat length and a second width, wherein:
         the ratio of the first repeat length of the first electrodes to the second width of the second electrodes is approximately 1 to approximately 3, and
         the ratio of the second repeat length of the second electrodes to the first width of the first electrodes is approximately 1 to approximately 3.

2. The touch position-sensing panel of claim 1, wherein the first repeat length and the first width are different.

3. The touch position-sensing panel of claim 1, wherein the second repeat length and the second width are different.

4. The touch position-sensing panel of claim 1, wherein the first and second directions are perpendicular to each other.

5. A touch position-sensing panel comprising:
   a sensing area;
   a substrate;
   a plurality of first electrodes formed of a conductive material, at least one of the first electrodes formed from a plurality of conductive lines each having a width of less than 20 microns; and
   a plurality of second electrodes formed of a conductive material, at least one of the second electrodes formed from a plurality of conductive lines each having a width of less than 20 microns, wherein:
      the plurality of first electrodes are arranged in a first direction,
      the plurality of second electrodes are arranged in a second direction different from the first direction such that the first and second electrodes overlap in the sensing area,
      each first electrode has an outer boundary encompassing a first central region having a striped shape in the first direction, and two corresponding first and second side regions on opposite sides of and parallel to, the first central region, the first and second side regions comprising a first plurality of arms,
      wherein the outer boundary of each of the first electrodes encompasses a portion of the first central region, and a portion of the corresponding first and second side regions,
      the outer boundary of each of the first electrodes has an interpolated pattern such that a side region of at least one first electrode is interleaved with a side region of an adjacent first electrode, the at least one first electrode and the adjacent first electrode being interleaved on a first side of the substrate,
      each second electrode has an outer boundary encompassing a second central region having a striped shape in the second direction, and two corresponding first and second side regions on opposite sides of, and parallel to, the second central region, the first and second side regions comprising a second plurality of arms,
      wherein the outer boundary of each second electrode encompasses a portion of the second central region, and a portion of the corresponding first and second side regions,
      the outer boundary of each of the second electrodes has an interpolated pattern such that a side region of at least one second electrode is interleaved with a side region of an adjacent second electrode, the at least one second electrode and the adjacent second electrode being interleaved on a second side of the substrate,
   wherein:
      each outer boundary of the plurality of first electrodes are shaped as a repeating pattern having a first repeat length and a first width, and
      each of the plurality of second electrodes have an outer boundary shaped as a repeating pattern having a second repeat length and a second width, and
   wherein:
      the ratio of the first repeat length of the first electrodes to the second width of the second electrodes is a first rational number, and
      the ratio of the second repeat length of the second electrodes to the first width of the first electrodes is a second rational number.

6. The touch position-sensing panel of claim 5, wherein the first electrodes are arranged such that the outer boundary of each first electrode encompasses all of the first central region and the combined outer boundaries of two adjacent first electrodes encompass all of the first side region, except for a gap between the edges of the adjacent side regions.

7. The touch position-sensing panel of claim 6, wherein an area of the first side region of the first electrode is equal to an area of the first center region of the first electrode.

8. The touch position-sensing panel of claim 5, wherein the second electrodes are arranged such that the outer boundary of each second electrode encompasses all of the second central region and the combined outer boundaries of the two adjacent second electrodes encompass all of the second side region, except for a gap between the edges of the adjacent side regions.

9. The touch position-sensing panel of claim 5, wherein the first and second directions are perpendicular to each other.

10. The touch position-sensing panel of claim 5, wherein the first electrodes are drive electrodes comprised of ITO.

11. The touch position-sensing panel of claim 5, wherein the first electrodes are sense electrodes and the plurality of conductive lines that form the at least one of the first electrodes comprises a mesh pattern of a conductive metal.

12. The touch position-sensing panel of claim 5, wherein the second electrodes are sense electrodes and the plurality of conductive lines that form the at least one of the second electrodes comprises a mesh pattern of a conductive metal.

13. The touch position-sensing panel of claim 5, wherein the first repeat length is 1 and the second width is 3.

14. The touch position-sensing panel of claim 5, wherein the first repeat length is 7 and the second width is 8.

15. The touch position-sensing panel of claim 5, wherein the portion of the corresponding first and second side regions encompassed by the first electrode is equal to the portion of the corresponding first and second side regions encompassed by the second electrode.

16. The touch position-sensing panel of claim 5, wherein an end of an outer boundary of one of the first electrodes is aligned with a side edge of an outer boundary for one of the second electrodes, and an end of the outer boundary of the second electrode is aligned with a side edge of an outer boundary of the first electrode.

17. The touch position-sensing panel of claim 5, wherein the first plurality of arms alternate such that an arm of the first side region is not in the same row as an arm of the second side region.

18. The touch position-sensing panel of claim 5, wherein the second plurality of arms alternate such that an arm of the first side region is not in the same row as an arm of the second side region.

19. The touch position-sensing panel of claim 5, wherein the second repeat length is approximately 1 and the first width is approximately 3.

* * * * *